(12) United States Patent
Shimazaki et al.

(10) Patent No.: US 6,754,598 B2
(45) Date of Patent: Jun. 22, 2004

(54) ELECTROMAGNETIC INTERFERENCE ANALYSIS METHOD AND APPARATUS

(75) Inventors: Kenji Shimazaki, Hyogo (JP); Shouzou Hirano, Osaka (JP); Hiroyuki Tsujikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 10/193,734

(22) Filed: Jul. 12, 2002

(65) Prior Publication Data

US 2003/0057966 A1 Mar. 27, 2003

(30) Foreign Application Priority Data

Jul. 13, 2001 (JP) .................................... P2001-213970

(51) Int. Cl.[7] ............................................. G06F 19/00
(52) U.S. Cl. ........................... 702/70; 702/66; 702/70; 702/116; 702/190; 324/750; 703/19; 438/26; 438/63; 361/99; 361/816; 361/818
(58) Field of Search .............................. 702/66, 70, 116, 702/117, 189.1, 90, 57, 187, 190, 194, 195, FOR 103, 104, 105, 108, 155, 156, 157, 164, 166, 171; 324/750; 703/19; 361/816, 818, 9; 438/59, 63, 26–28, 17, 57; 333/24 R, 32, 112, 118

(56) References Cited

U.S. PATENT DOCUMENTS 5,337,261 A * 8/1994 Rogers ....................... 702/190
5,639,989 A * 6/1997 Higgins, III ............. 174/35 MS
6,125,044 A * 9/2000 Cherniski et al. ............ 361/799
6,150,895 A * 11/2000 Steigerwald et al. .......... 333/12

OTHER PUBLICATIONS

Shimazaki et al., 'LEMINGS: LSI's EMI–Noise Analysis with Gate Level Simulator', Jan. 2000, Matsushita Corp., pp. 1–8.*

Tabata et al., 'Malfunctions of High Impedance Circuits Caused by Electrostatic Discharge', Dec. 1998, IEEE, pp. 1578–1583.*

Diaz–Alvarez et al., 'Design, Simulation, Fabrication, and Characterization of Package–Level Micro–Shielding for EMI/EMC Management in BGA [Ball Grid Array] Environment', Jan. 2000, IEEE Pub., pp. 793–798.*

Sudo et al., 'Electromagnetic Radiation and Simultaneous Switching Noise In a CMOS Device Packaging', Jan. 2000, IEEE, pp. 781–785.*

* cited by examiner

Primary Examiner—Marc S. Hoff
Assistant Examiner—Elias Desta
(74) Attorney, Agent, or Firm—McDermott, Will & Emery

(57) ABSTRACT

A method of analyzing an electromagnetic interference amount of an LSI includes an equivalent impedance information calculating step of calculating and estimating equivalent impedance information based on circuit information of an LSI chip and package information of the LSI chip, and an electromagnetic interference noise calculating step of calculating an electromagnetic interference noise based on the equivalent impedance information.

50 Claims, 26 Drawing Sheets

ELECTROMAGNETIC INTERFERENCE ANALYSIS METHOD AND APPARATUS

BACKGROUND OF THE INVENTION

The present invention relates to an electromagnetic interference (EMI) analysis method and apparatus, and more particularly, to a method capable of carrying out an EMI analysis at a high speed with high precision for a large-scaled high-speed driving LSI (Large-Scaled Semiconductor Integrated Circuit). The method also allows for analyzing an electromagnetic interference in the case in which there is no current information.

The utilization range of the LSI has been enlarged to a communication apparatus such as a mobile telephone, general home products, toys and automobiles as well as a computer. On the other hand, there is a problem in that electromagnetic interference generated from these products causes radio interference noise for receivers contained in, for example, a television or a radio and/or the malfunction of other systems. Countermeasure for preventing such interference, such as, filtering or shielding has also been attempted to solve such problems. However, the noise suppression of an LSI package has been highly demanded as a result of an increase in the number of components, an increase in a cost and the difficulty to take effective countermeasure.

Under the circumstances, the LSI is positioned as a key device in each product, and an increase in the scale and speed of the LSI has been required to maintain the competition power of the product. In order to meet these requirements with a reduction in the product cycle, it is necessary to automate the LSI design. The necessity of employing a synchronous design has been increased as the present conditions for introducing a design automation technology.

As shown in FIG. 30, conventionally, there has been proposed a method in which an LPE (layout element extraction) processing for creating a netlist (a circuit connection information file) including a parasitic resistance and a capacitance component is executed by using an EMI dedicated library 3101 and layout information 3102 which are obtained by previously characterizing the internal capacitance and input capacitance of a cell (step 3103) and the total capacitance of a block is calculated (step 3105).

Similarly, a block netlist 3106 is also subjected to the LPE, and the supply current of the block is calculated under the condition of no resistance of the power supply line and no supply capacitance of the power supply line (step 3107), and thereby, the current on the power supply line can be obtained.

Moreover, the current model of the total block capacitance and supply current is connected to a power netlist 3104 which is subjected to the LPE in the same manner.

The connection information is subjected to a transistor level simulation, thereby estimating an EMI noise (step 3109).

Thus, an EMI spectrum 3110 is obtained.

However, when utilizing this method, there is a problem in that a special library for capacitance estimation is required.

Moreover, since a transistor level simulator is used for the supply current calculation, there is a problem in that a very long time is required for the operation.

Furthermore, since the LEP is carried out including a power supply, a very long time is required for the operation.

In addition, the power netlist, the capacitance information and the supply current information are collectively subjected to the transistor level simulation. For this reason, there is a problem in that a very long time is also required for this operation.

Therefore, in order to increase the speed of the operation, there has been proposed a method of extracting an RLC by means of an impedance analyzer.

In this method, as shown in FIG. 31, R3203, L3204 and C3205 are calculated from LSI information 3201 by using an impedance analyzer 3202. Then, these values, a supply current spectrum 3210 obtained by carrying out a supply current estimation 3209 on a gate level from a load capacitance 3206, a gate level netlist 3207 and a test vector 3208, and the supply current spectrum 3210 and the RLC are used to carry out an EMI estimation (step 3211) so that an EMI spectrum 3212 is obtained.

In this method, the supply current can be estimated on the gate level. Therefore, the operation can be carried out at a high speed.

Moreover, since the RLC information capable of being obtained from an actual chip at a high speed is used, the speed of the processing can be increased.

Furthermore, in the EMI estimation, the frequency response of a power measuring system netlist determined from the RLC information is multiplied by the supply current spectrum without using the transistor level simulation. Therefore, the speed of the operation can be increased.

In addition, an analysis is carried out based on information to be used in a standard gate level verification flow. Consequently, special processing and particular information are not required.

However, this method is based on the results of actual measurements. For this reason, there has conventionally been a problem in that a method of accurately predicting the RLC in the design stage cannot be proposed.

Although the speed is higher than that of the transistor level simulation, the gate level simulation is still required. Therefore, there has been a problem in that a long time is required for the operation.

Moreover, there has been a problem in that the prediction is difficult in a floor plan stage in which a netlist is not determined.

Under the circumstances described above, in the LSI design, it is apparent that the EMI should be estimated as early as possible and the design should be changed in the early stages when necessary in order to obtain the shortest technique for easily carrying out reliable LSI design. Utilizing the known techniques, however, there is no method of carrying out the EMI analysis in the floor plan stage prior to the LSI design.

SUMMARY OF THE INVENTION

The invention has been made in consideration of the foregoing problems and it is an object of the present invention to provide an electromagnetic interference analysis method and apparatus which can carry out an EMI analysis in the early stage of a design and which can reflect the information of a circuit and a package on a calculation while performing a high-speed analysis, thereby evaluating the electromagnetic interference of an LSI on a simulation in actual time.

In particular, the invention has an object to provide a method capable of carrying out an EMI analysis in a floor plan stage without calculating supply current information.

The invention provides a method of analyzing an electromagnetic interference amount of an LSI, including an equivalent impedance information calculating step of calculating and estimating equivalent impedance information based on circuit information of an LSI chip and package information of the LSI chip, and an electromagnetic interference noise calculating step of calculating an electromagnetic interference noise based on the equivalent impedance information.

According to such a structure, the equivalent impedance information is calculated from the circuit information and the package information without calculating the supply current information from the circuit information of the LSI chip, and a capacitance countermeasure correction is then carried out. Therefore, an electromagnetic interference analysis can easily be performed at a high speed. Moreover, the analysis can be carried out based on only the circuit information in the early design stage. Consequently, a chip area, a power supply or a package can easily be changed, the degree of freedom for taking an electromagnetic interference countermeasure can be increased and electromagnetic interference can be reduced.

Moreover, it is desirable that the equivalent impedance information calculating step should include a first extracting step of extracting a chip area, a power pad position and power supply information from the circuit information and a second extracting step of extracting a package type from the package information, and equivalent impedance information should be calculated and estimated based on the information obtained at the first and second extracting steps.

According to such a structure, the chip area, the power pad position and the power supply information are extracted from the circuit information. Once this information is determined, the equivalent impedance can be calculated. Thus, it is possible to easily obtain desirable information.

It is desirable that the circuit information should include floor plan information.

According to such a structure, the equivalent impedance is calculated based on the floor plan information. Therefore, the electromagnetic interference analysis can be carried out in the initial stage of a circuit design, the design can be easily executed again, and an optimized design can be realized without restriction.

It is desirable that the circuit information should include layout information.

According to such a structure, layout data has a high degree of concreteness. Therefore, equivalent impedance information having high precision can be calculated. Based on the value, the electromagnetic interference analysis is carried out. If the electromagnetic interference analysis is to be performed in a layout design stage, consequently, it is possible to carry out the electromagnetic interference analysis with higher precision and higher reliability. Thus, the equivalent impedance information is calculated from the circuit information on a layout level and the electromagnetic interference analysis is carried out based on the value. Therefore, if the electromagnetic interference analysis is to be performed in such a stage that a layout is once fixed, it is possible to carry out the electromagnetic interference analysis with higher precision and higher reliability.

It is desirable that the circuit information should include netlist information.

According to such a structure, it is possible to carry out the electromagnetic interference analysis with higher precision. Moreover, the number of transistors can be known by only a netlist without floor plan information, and an area (a resistance) can be estimated based on the number of transistors. Furthermore, it is also possible to estimate a capacitance from the connection information of the netlist.

Moreover, it is desirable that the netlist information should include circuit information on a function level.

According to such a structure, it is possible to further reduce an operation time as compared with circuit information on a gate level. Furthermore, it is possible to calculate an equivalent impedance adapted to an LSI design phase.

It is desirable that the netlist information should include circuit information on a gate level.

According to such a structure, it is possible to further reduce an operation time as compared with circuit information on a transistor level. Furthermore, it is possible to calculate an equivalent impedance adapted to an LSI design phase.

It is desirable that the netlist information should include circuit information on a transistor level.

According to such a structure, it is possible to easily calculate an equivalent impedance from the circuit information on the transistor level in consideration of a device component. More specifically, the netlist on the transistor level is extracted from the layout data, and agate capacitance, a wiring capacitance, a power capacitance and an MOS capacitance (a capacitance between a power line and a grounding conductor) are calculated. Consequently, it is possible to easily calculate equivalent impedance information.

It is desirable that the equivalent impedance information calculating step should estimate a memory block as a capacitance from the circuit information so as to be executed.

According to such a structure, data using a memory block as a capacitance are utilized. Therefore, it is possible to calculate an equivalent impedance in consideration of a parasitic component as well. The electromagnetic interference analysis can be carried out in the initial stage of a circuit design, the design can easily be carried out again and an optimized design can be realized without restriction.

It is desirable that the equivalent impedance information calculating step should serve to estimate a capacitance in consideration of an activation ratio.

According to such a structure, a device element and a parasitic element are extracted as a gate capacitance, a wiring capacitance, a power capacitance and an MOS capacitance (a gate capacitance between a power line and a grounding conductor). The element is not operated as capacitance when the element is set in an operation state (active). Therefore, a capacitance value is multiplied by an activation ratio $\beta$ so that an equivalent capacitance having higher precision can be obtained. The activation ratio of a cell or element can be obtained based on the dynamic analysis of an operation/non-operation.

Furthermore, it is desirable that the equivalent impedance information calculating step should include a step of estimating a resistance value from the circuit information.

According to such a structure, it is possible to easily carry out an EMI analysis with high precision.

Moreover, it is desirable that the equivalent impedance information calculating step should include a step of extracting circuit connection information from the circuit information, and furthermore, creating circuit connection information in which an active element is substituted for a predetermined resistance and calculating an equivalent resistance.

According to such a structure, the resistance of a power supply can be estimated very easily, and the EMI analysis can readily be carried out with higher precision.

According to such a structure, a LPE for a power supply line is carried out and a transistor connecting terminal is connected through a resistor (an ON-state resistor and a cutoff resistor), for example, and an equivalent resistance is estimated with a current amount on the power supply, for example. Consequently, it is possible to easily obtain equivalent impedance information without supply current information. Thus, the electromagnetic interference analysis can be carried out.

Moreover, it is desirable that the equivalent impedance information calculating step should include a step of estimating a resistance value based on a chip area from the circuit information.

If the chip area is determined, a coefficient obtained from the sheet resistance of a circuit pattern and previously measured statistic information is multiplied so that an equivalent resistance can easily be obtained in a floor plan stage.

It is desirable that the equivalent impedance information calculating step should include a step of changing inductance information for a wire length into a database, a step of calculating the wire length from the circuit information and the package information, and a step of extracting the inductance information changed into the database from the wire length, thereby estimating an inductance. Incidentally, the wire is lead frame and wire bonding.

An inductance obtained by a wire is predominant. Therefore, if the inductance for the wire length is previously changed in a database to obtain the wire length from a package pin and a power pad position and to estimate the inductance from the database, it is possible to estimate the inductance very easily with high precision.

It is desirable that the method should include a noise estimating step of estimating an EMI noise based on an equivalent impedance obtained at the equivalent impedance information calculating step.

According to such a structure, it is possible to estimate the EMI noise without obtaining the supply current information.

Moreover, it is desirable that the noise estimating step should include a step of calculating a frequency response characteristic of the LSI from the equivalent impedance and the circuit information and a step of estimating an EMI noise of the LSI in a specific frequency band based on the frequency response characteristic.

According to such a structure, the frequency response characteristic of the LSI is calculated from the equivalent impedance and the circuit information without obtaining the supply current information and the EMI noise is thereby estimated. Therefore, it is possible to easily carry out the EMI analysis with high precision in the initial stage of a design. Consequently, the design can easily be changed, and furthermore, uselessness can be eliminated.

It is desirable that the noise estimating step should include a step of calculating an offset value based on a clock frequency and an estimated consumption power and a step of multiplying the frequency response characteristic by the offset value.

According to such a structure, it is possible to easily carry out a noise estimation.

It is desirable that the method should further include a correcting step of carrying out a correction in order to optimize an EMI noise based on the equivalent impedance.

According to such a structure, the correction for optimizing the EMI noise is carried out depending on the equivalent impedance information thus obtained. Consequently, the EMI noise can be suppressed without trial and error. Thus, an optimization can easily be realized.

Moreover, it is desirable that the correcting step should include a step of correcting a power terminal position, a package type and a wire length in order to correct an inductance estimated at the estimating step.

According to such a structure, it is preferable that the inductance estimated at the estimating step should be optimized by correcting the power terminal position, the package type and the wire length. Therefore, the EMI noise can be suppressed without an increase in an area and the optimization can easily be realized efficiently.

It is desirable that the correcting step should include a step of correcting a signal wiring capacitance such that a timing has no problem from the capacitance estimated at the estimating step.

According to such a structure, it is preferable that the signal wiring capacitance should be corrected to have no timing delay. Thus, the optimization can easily be realized efficiently.

Furthermore, it is desirable that the step of correcting a signal wiring capacitance should include a step of correcting a signal wiring width, a signal wiring length and a signal wiring path.

The signal capacitance can be regulated based on the wiring width, the wiring length and the wiring path. By correcting these values, therefore, the correction can be carried out very easily.

Moreover, it is desirable that the correcting step should include a power wiring layout correcting step of correcting a power wiring layout such that a voltage drop has no problem.

When the capacitance value is greatly changed, the voltage drop becomes a problem. By adjusting the power wiring layout, however, the correction can be carried out.

It is desirable that the power wiring layout correcting step should include a step of correcting a power path, a power wiring width and a power wiring length.

According to such a structure, the correction of the power wiring capacitance can easily be optimized by the correction of the power path, the power wiring width and the power wiring length.

It is desirable that the correcting step should include a step of correcting a decoupling capacitance.

According to such a structure, the decoupling capacitance for optimizing the EMI noise is corrected depending on the equivalent impedance information thus obtained. Therefore, it is possible to suppress the EMI noise without trial and error. Thus, the optimization can easily be realized.

It is desirable that the correcting step should include a step of correcting a connection relationship between a power supply and a capacitance.

According to such a structure, the magnitude of the equivalent impedance is optimized by only changing the arrangement of the impedance without varying the area of a chip for constituting the impedance. Consequently, the EMI noise can be suppressed without an increase in the area so that the optimization can easily be realized efficiently.

In the method, by directly calculating the equivalent impedance from the circuit information without calculating the supply current information, it is possible to easily carry out the EMI analysis. It is apparent that the method is also effective for the case in which the supply current information is calculated and the EMI analysis is carried out based on the supply current information.

More specifically, in the method of analyzing an electromagnetic interference amount of an LSI, it is also possible to calculate equivalent supply current information sent to a supply current from the circuit information of the LSI chip, to consider, as analysis control information, at least one of the power supply information of a power supply for supplying a current to the LSI chip, the package information of the package of the semiconductor chip and the measuring system information of a measuring system for measuring the characteristic of the semiconductor chip, to estimate, as an equivalent circuit, general information obtained by reflecting the analysis control information on the circuit information and to execute an analysis in accordance with the general information thus estimated.

According to the structure, it is possible to analyze an electromagnetic interference caused by the power supply and the package at a high speed with a small memory and high precision in addition to an electromagnetic interference caused by the circuit of the LSI chip.

Moreover, it is also possible to temporarily determine a power supply for supplying a current to the LSI chip and to include at least one of the power supply information, the package information of the package of the semiconductor chip and the measuring system information of the measuring system for measuring the characteristic of the semiconductor chip, thereby obtaining an equivalent impedance.

Based on the result obtained by the electromagnetic interference analysis method, the circuit information is optimized to reduce an electromagnetic interference. Consequently, it is possible to realize a circuit design having a smaller electromagnetic interference.

In the electromagnetic interference analysis method according to the invention, furthermore, the circuit information obtained at the optimizing step may be displayed as optimized information.

Moreover, the invention provides an electromagnetic interference analysis apparatus including equivalent impedance information calculating means for calculating and estimating equivalent impedance information based on circuit information of an LSI chip and package information of the LSI chip, and electromagnetic interference noise calculating means for calculating an electromagnetic interference noise based on the equivalent impedance information.

It is desirable that the equivalent impedance information calculating means should extract a chip area, a power pad position and power supply information from the circuit information and should extract a package type from the package information, and the electromagnetic interference noise calculating means should include estimating means for calculating and estimating equivalent impedance information based on the information thus extracted.

Moreover, it is desirable that the circuit information should include floor plan information.

It is desirable that the circuit information should include layout information.

It is desirable that the circuit information should include netlist information.

It is desirable that the netlist information should include circuit information on a function level.

It is desirable that the netlist information should include circuit information on a gate level.

It is desirable that the netlist information should include circuit information on a transistor level.

It is desirable that the equivalent impedance information calculating means should be capable of estimating a memory block as a capacitance from the circuit information so as to be executed.

It is desirable that the equivalent impedance information calculating means should include estimating means for estimating a capacitance in consideration of an activation ratio.

It is desirable that the equivalent impedance information calculating means should include means for estimating a resistance value from the circuit information.

It is desirable that the equivalent impedance information calculating means should include equivalent resistance calculating means for extracting circuit connection information from the circuit information, and furthermore, creating circuit connection information in which an active element is substituted for a predetermined resistance and calculating an equivalent resistance.

It is desirable that the equivalent impedance information calculating means should include resistance value estimating means for estimating a resistance value based on a chip area from the circuit information.

It is desirable that the equivalent impedance information calculating means should include means for changing inductance information for a wire length into a database, wire length calculating means for calculating the wire length from the circuit information and the package information, and extracting means for extracting the inductance information changed into the database from the wire length, thereby estimating an inductance.

It is desirable that the apparatus should include noise estimating means for estimating an EMI noise based on an equivalent impedance obtained by the equivalent impedance information calculating means.

It is desirable that the noise estimating means should include means for calculating a frequency response characteristic of the LSI from the equivalent impedance and the circuit information and estimating means for estimating an EMI noise of the LSI based on the frequency response characteristic.

It is desirable that the noise estimating means should include means for calculating an offset value based on a clock frequency and an estimated consumption power and means for multiplying the frequency response characteristic by the offset value.

It is desirable that the apparatus should further include correcting means for carrying out a correction in order to optimize an EMI noise based on the equivalent impedance thus obtained.

It is desirable that the correcting means should include correcting means for correcting a power terminal position, a package type and a wire length in order to correct the inductance estimated by the estimating means.

It is desirable that the correcting means should include capacitance correcting means for correcting a signal wiring capacitance such that a timing has no problem based on the capacitance estimated by the estimating means.

It is desirable that the correcting means for correcting a signal wiring capacitance should include correcting means for correcting a signal wiring width, a signal wiring length and a signal wiring path.

It is desirable that the correcting means should include power wiring layout correcting means for correcting a power wiring layout such that a voltage drop has no problem.

It is desirable that the power wiring layout correcting means should include correcting means for correcting a power path, a power wiring width and a power wiring length.

It is desirable that the correcting means should include capacitance correcting means for correcting a decoupling capacitance.

It is desirable that the correcting means should include connection relationship correcting means for correcting a connection relationship between a power supply and a capacitance.

Also in such an electromagnetic interference analysis apparatus, mainly, it is possible to easily carry out the EMI analysis by directly calculating an equivalent impedance from circuit information without calculating supply current information in the same manner as in the method. However, it is apparent that the electromagnetic interference analysis apparatus is also effective for the case in which the supply current information is calculated and the EMI analysis is carried out based on the supply current information.

DETAILED DESCRIPTION OF PREFERRED EMBODIMENT

Embodiments of an electromagnetic interference analysis method according to the invention will be described below.

Embodiment 1

Figure 1:
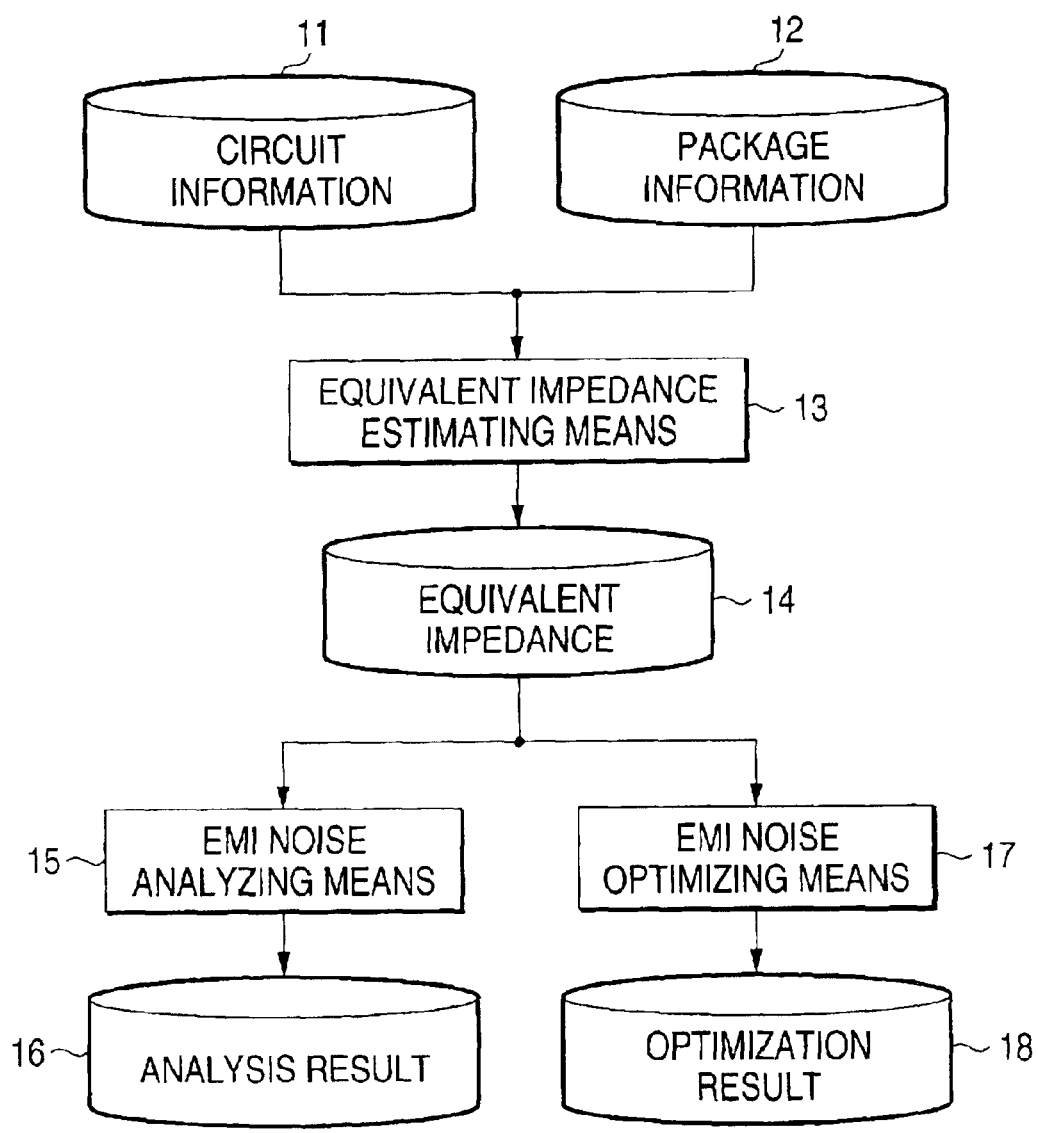
FIG. 1 is a block diagram showing a structure for implementing an electromagnetic interference analysis method according to a first embodiment of the invention.

FIG. 1 is a conceptual diagram showing the whole structure of an electromagnetic interference analysis apparatus for carrying out the electromagnetic interference analysis method according to the invention.

The electromagnetic interference analysis apparatus includes equivalent impedance information estimating means 13 for calculating and estimating equivalent impedance information based on circuit information 11 of an LSI chip and package information 12 of the LSI chip, and electromagnetic interference (EMI) noise analyzing means 15 for calculating and analyzing an electromagnetic interference noise based on equivalent impedance information 14, and serves to output an analysis result 16. Furthermore, the electromagnetic interference analysis apparatus includes optimizing means 17 for optimizing an electromagnetic interference noise based on the equivalent impedance information 14 obtained by the equivalent impedance information estimating means 13, and serves to carry out an optimization by using the optimizing means 17 and to perform a layout design based on an optimization result 18 thus obtained.

Figure 2:
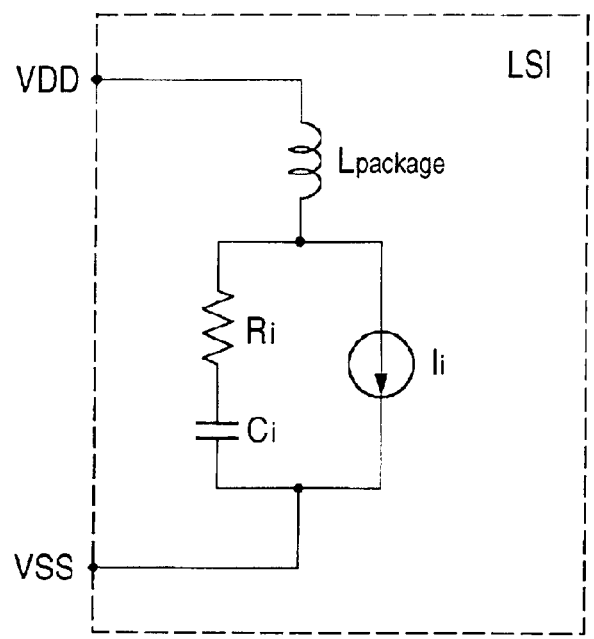
FIG. 2 is a diagram for explaining the electromagnetic interference analysis method according to the first embodiment of the invention.

The equivalent impedance information estimating means 13 is so constituted as to extract a chip area and a power pad position, the width, length and material of a power wiring, and a package type from the circuit information 11, power supply information and package information respectively, and can obtain R, L and C information shown in FIG. 2 from these information.

The electromagnetic interference analysis apparatus can be executed based on the circuit information in a floor plan stage.

Next, description will be given to a method of executing an electromagnetic interference analysis by using the electromagnetic interference analysis apparatus.

Figure 3:
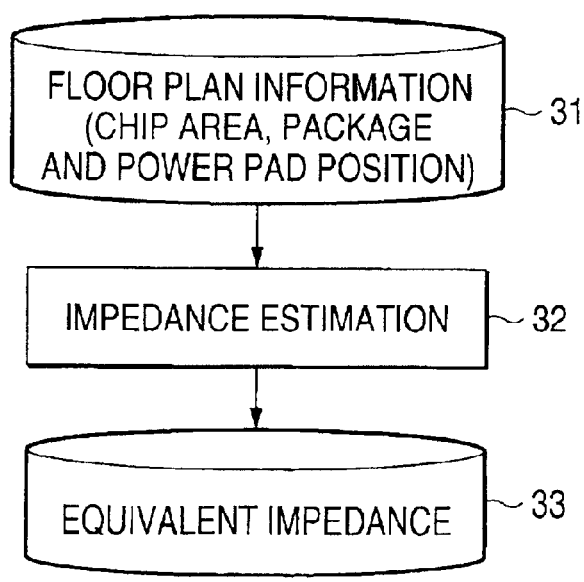
FIG. 3 is a diagram showing the electromagnetic interference analysis method according to the first embodiment of the invention.

First of all, a function design is carried out in the floor plan stage and a logic design is then carried out. In this stage, the chip area is determined, the width, length and material of the power wiring are obtained from the power supply information, and furthermore, the power pad position is obtained from the package type acquired from the package information 12 as shown in FIG. 1, and a resistance R and a capacitance C of a power wiring and an inductance L of a connecting portion are estimated from these values (floor plan information 31) by the equivalent impedance estimating means 13 (step 32) so that an equivalent impedance 33 is obtained as shown in FIG. 3.

When the chip area is determined, the resistance R is defined. When the package and the power pad position are determined, the length of a lead is defined so that the inductance is determined. There have been proposed various methods as a method of estimating the resistance or the inductance. A general resistance value can be calculated by a simple multiplication of a chip area by a coefficient.

Since an approximate area of a power supply is determined from the chip area, a power capacitance is estimated. Moreover, when the chip area is determined, the number of transistors is estimated and a gate capacitance is also estimated. When the occupation area of the transistor is estimated from the chip area and the number of transistors, a wiring capacitance is estimated.

Thus, an equivalent impedance capacitance is estimated without calculating supply current information from the circuit information. Therefore, an operation quantity can be decreased. Thus, it is possible to execute a reliable electromagnetic interference analysis with high precision at a high speed.

Based on the analysis result 16 thus obtained, an EMI noise is optimized by using the EMI noise optimizing means 17, thereby obtaining optimum RTL information.

Embodiment 2

Figure 4:
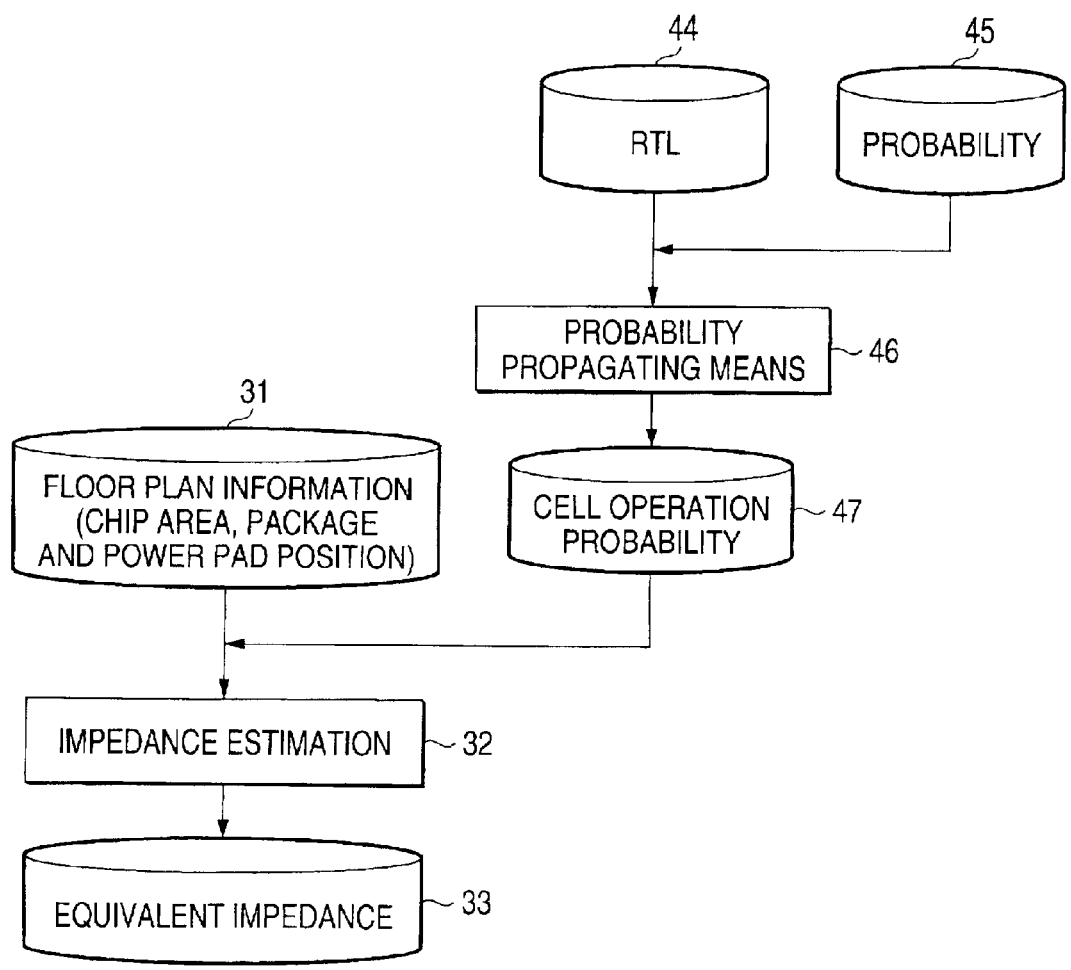
FIG. 4 is a diagram showing an electromagnetic interference analysis method according to a second embodiment of the invention.

As a second embodiment, a cell operation probability 47 is calculated according to the propagation probability of probability propagating means 46 in consideration of an operation probability 45 based on circuit information 44 at an RTL (register transfer logic) level, and an impedance is estimated from the floor plan information 31 in consideration of the cell operation probability 47 as shown in FIG. 4.

Figure 5:
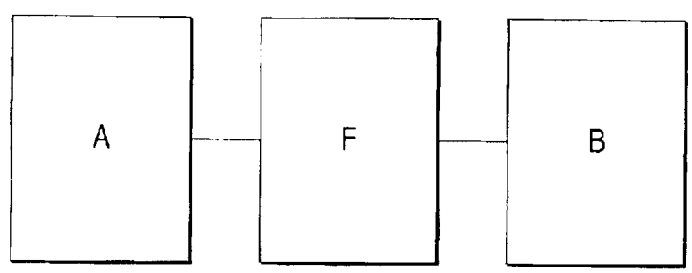
FIG. 5 is a diagram showing the electromagnetic interference analysis method according to the second embodiment of the invention.

In this example, a function design is carried out in a floor plan stage and a logic design is then carried out. In this stage, a chip area is determined based on the circuit information at the RTL (register transfer logic) level including an A block, an F block and a B block shown in FIG. 5, and the width, length and material of a power wiring are obtained from power supply information. Furthermore, a power pad position is obtained from a package type acquired from package information 12, and a resistance R and a capacitance C of a power wiring and an inductance L of a connecting portion are estimated from these values (floor plan information 31) by equivalent impedance estimating means 13 (step 32) so that an equivalent impedance 33 is obtained.

In the embodiment, a flow includes a processing of calculating the activation ratio of a cell from the operation probability of the cell by using the operation probability 45, thereby optimizing the capacitance C (see a sixteenth embodiment) and is not always required. According to this method, it is possible to carry out an electromagnetic interference analysis with higher precision.

Embodiment 3

As a third embodiment of the invention, description will be given to a method of estimating a resistance value.

Figure 6:
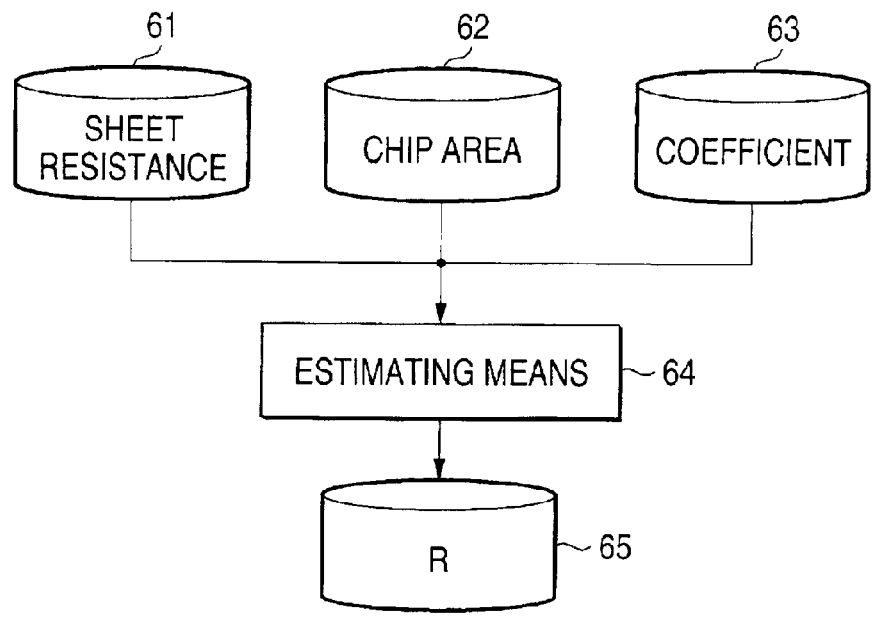
FIG. 6 is a diagram showing an electromagnetic interference analysis method according to a third embodiment of the invention.

In this method, as shown in FIG. 6, a sheet resistance 61 is obtained from a standard material to be used, and a resistance value 65 is estimated by estimating means 64 based on the sheet resistance 61, a chip area 62 and a coefficient 63 representing a correlation of a prepared chip area and a power supply area according to the type of a power wiring design.

Thus, a resistance value can easily be estimated.

Embodiment 4

As a fourth embodiment of the invention, description will be given to a method of estimating an inductance.

Figure 7:
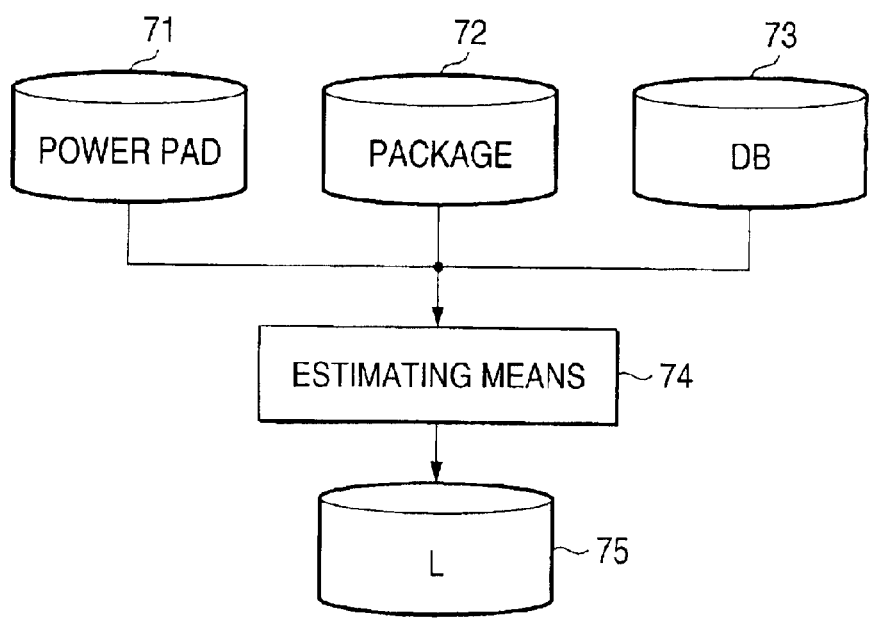
FIG. 7 is a diagram showing an electromagnetic interference analysis method according to a fourth embodiment of the invention.

In this method, as shown in FIG. 7, power pad information 71 including the number and positions of power pads is obtained from circuit information and the position and type of a package are obtained from package information 72. On the other hand, the value of an inductance for a wire length is changed into a database and a corresponding database is extracted from a database 73, and an inductance L is estimated by estimating means 74 to obtain an inductance 75.

Thus, it is possible to easily estimate the inductance.

Embodiment 5

As a fifth embodiment of the invention, description will be given to a method of estimating a noise by using EMI noise analyzing means.

Based on an equivalent impedance obtained by the equivalent impedance estimating means 13 shown in FIG. 1, an EMI noise is estimated by using EMI noise analyzing means 15. A frequency response characteristic is calculated from the equivalent impedance thus estimated and circuit information, and the EMI noise is estimated by a comparison with an equivalent chip.

Figure 8:
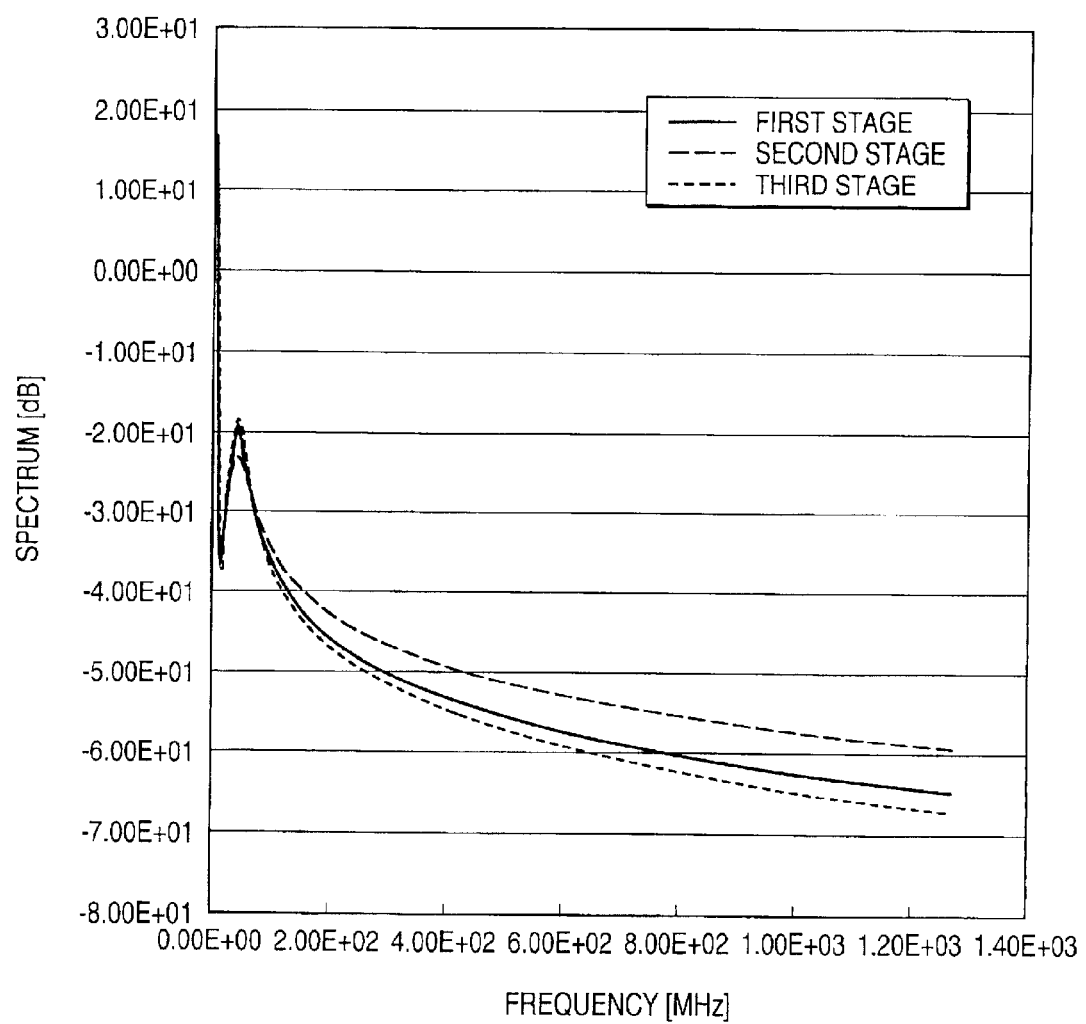
FIG. 8 is a chart showing a frequency response characteristic according to a fifth embodiment of the invention.

FIG. 8 shows data according to an example of the frequency response characteristic. An axis of ordinate indicates a current spectrum and an axis of abscissa indicates a frequency.

The frequency response characteristic in a frequency band to be used in FIG. 8 is checked. If it is decided that a frequency noise is greater than a predetermined value by the EMI noise analyzing means 15 shown in FIG. 1, an analysis result 16 indicating that the EMI noise is greater is output.

According to such a structure, the frequency response characteristic of an LSI is calculated from the equivalent impedance and the circuit information without obtaining supply current information, and the EMI noise is thus estimated. Therefore, it is possible to easily carry out an EMI analysis with high precision in the initial stage of a design. Consequently, the design can easily be changed and uselessness can be eliminated.

Embodiment 6

As a sixth embodiment of the invention, description will be given to a variant of a noise estimating method to be carried out by EMI noise analyzing means.

Figure 9:
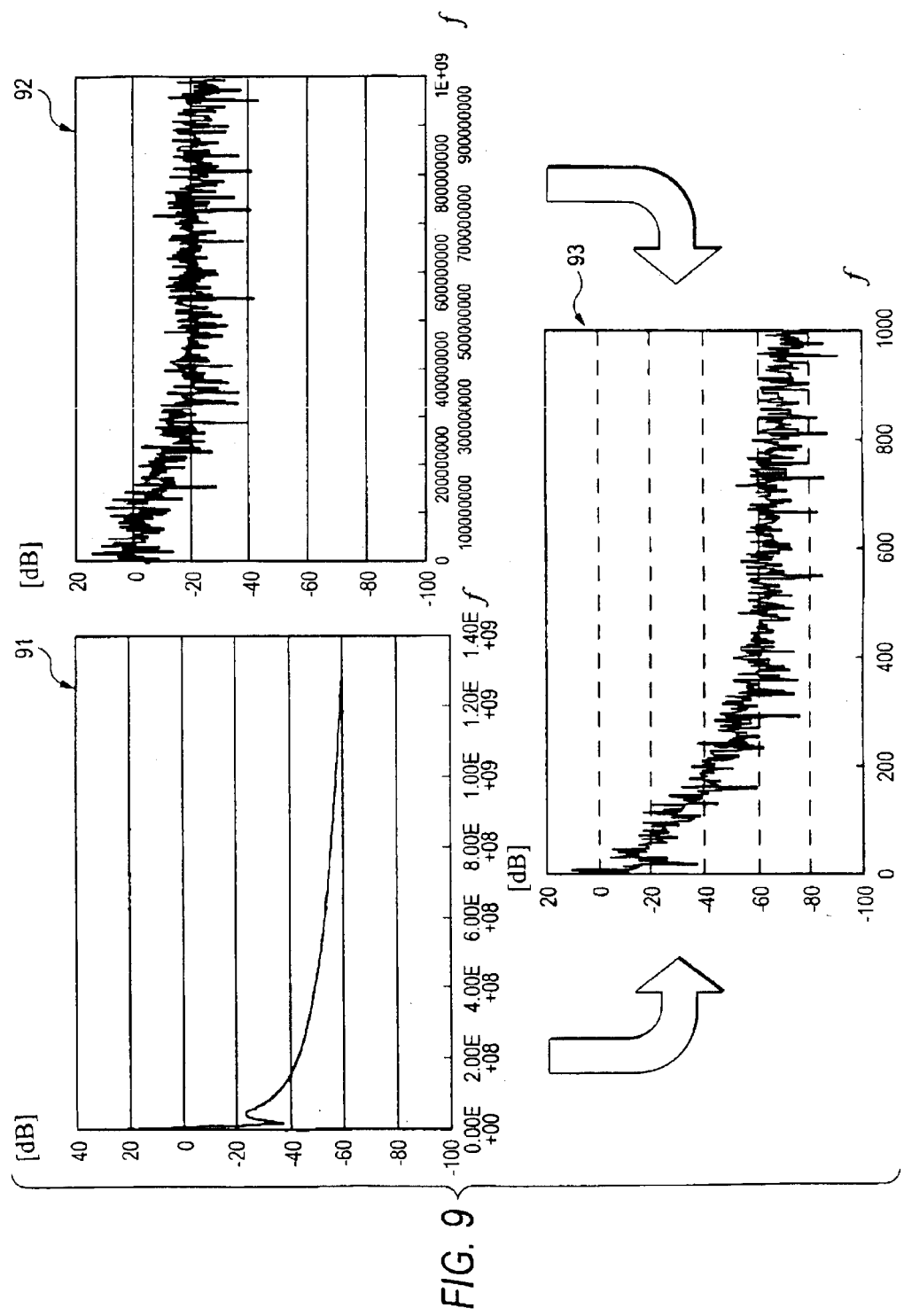
FIG. 9 is a chart showing a sixth embodiment of the invention.

In this example, as shown in FIG. 9, an offset value 92 determined from an estimated consumption power is calculated and a frequency response characteristic curve 91 obtained in the fifth embodiment is multiplied by the offset value. Thus, a current spectrum 93 is obtained from statistical information in consideration of a frequency.

Thus, it is possible to carry out the noise estimation with higher precision.

Embodiment 7

As a seventh embodiment of the invention, description will be given to a method of carrying out an EMI estimation based on equivalent impedance information obtained by EMI noise analyzing means and performing a correction based on the EMI estimation.

Figure 10:
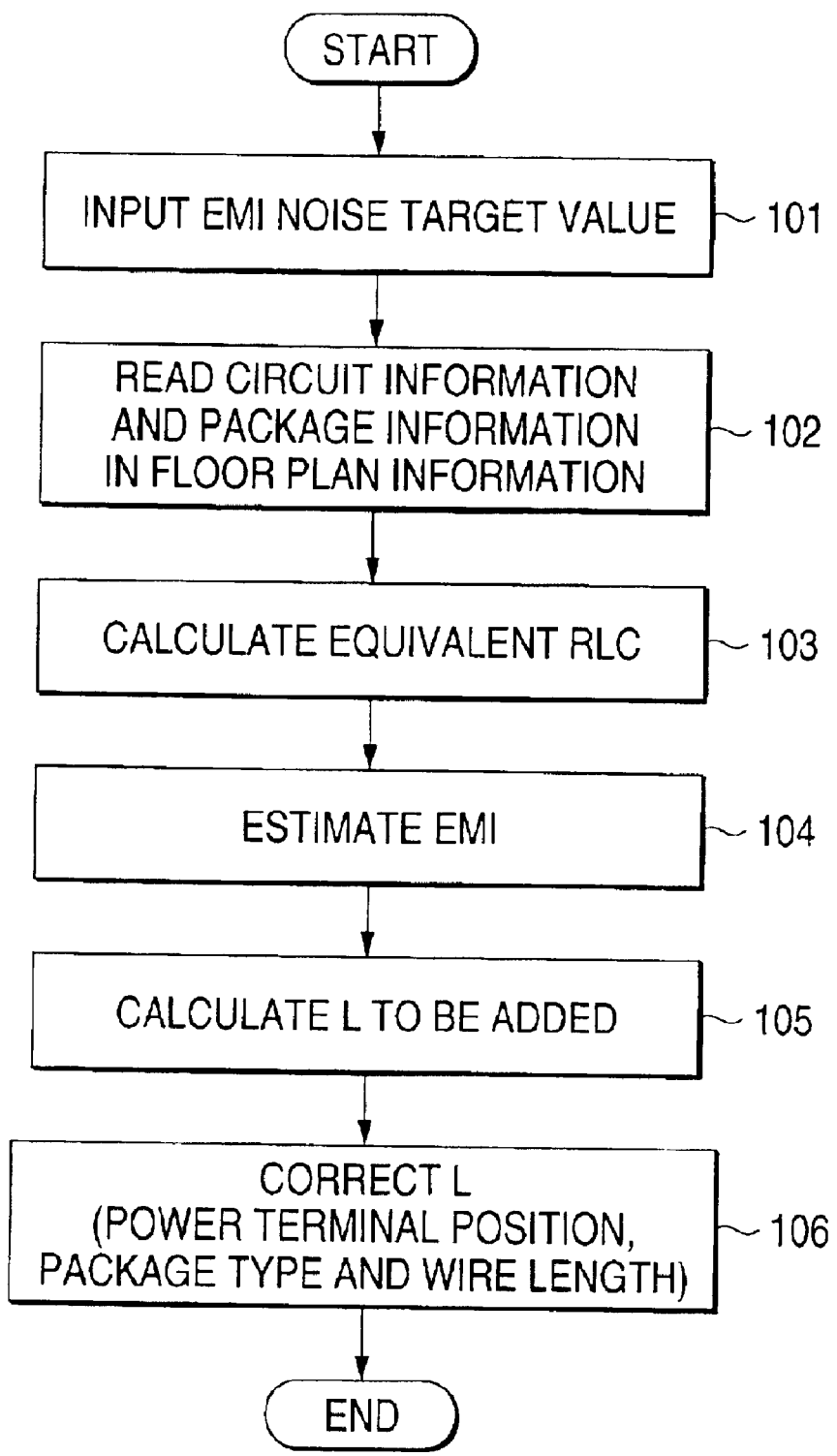
FIG. 10 is a flow chart showing an electromagnetic interference analysis method according to a seventh embodiment of the invention.

As shown in FIG. 10, in this example, the target value of an EMI noise is first input (step 101).

By using the equivalent impedance estimating means 13 shown in FIG. 1 (or by using the method according to each of the embodiments), circuit information 11 and package information 12 in a floor plan stage are read (step 102) and an equivalent impedance is estimated (step 103).

Then, an EMI noise is estimated from the equivalent impedance to obtain an estimated EMI noise in a desirable frequency band (step 104).

Thereafter, the estimated EMI noise is compared with the EMI noise target value which has already been input at the step 101 and an inductance to be added is calculated (step 105).

Subsequently, a power terminal position, a package type and a wire length for obtaining the required inductance are calculated and a correction in the floor plan stage is carried out (step 106).

Thus, the correction can easily be carried out. In the floor plan stage, the degree of freedom for changing various information is high and the correction can be carried out more easily than that in a layout stage.

Embodiment 8

While the method of carrying out an inductance correction has been described in the seventh embodiment, description will be given, as an eighth embodiment of the invention, a method of carrying out an EMI estimation based on equivalent impedance information obtained by EMI noise analyzing means and correcting a capacitance based on the EMI estimation.

Figure 11:
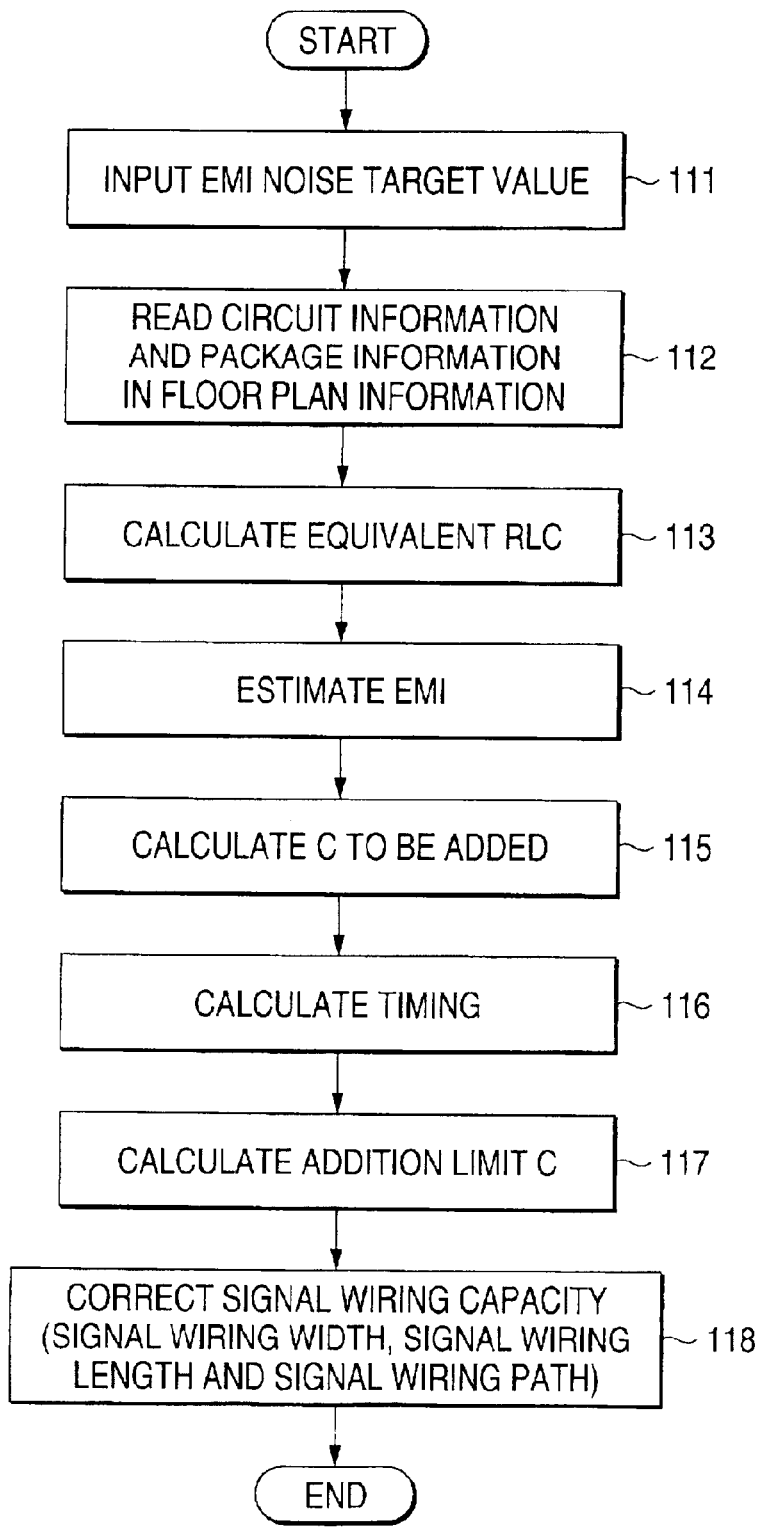
FIG. 11 is a flow chart showing an electromagnetic interference analysis method according to an eighth embodiment of the invention.

As shown in FIG. 11, a processing from a step 111 of inputting a target value of an EMI noise to a step 114 of estimating the EMI noise is the same as that of the seventh embodiment. In this example, a signal wiring capacitance addition is carried out in order to obtain the target value of the EMI noise.

First of all, the target value of the EMI noise is input (step 111).

By using the equivalent impedance estimating means 13 shown in FIG. 1 (or by using the method according to each of the embodiments), then, circuit information 11 and package information 12 in a floor plan stage are read (step 112), and an equivalent RLC calculation is carried out based on these information to estimate an equivalent impedance (step 113).

Thereafter, an EMI is estimated from the equivalent impedance to obtain an estimated EMI noise in a desirable frequency band (step 114).

Subsequently, the estimated EMI noise is compared with the EMI noise target value which has already been input at the step 111 to calculate a capacitance value to be added (step 115).

In the case in which a capacitance addition for obtaining the required capacitance value is carried out, the amount of delay of a timing is calculated and it is decided whether or not the delay ranges are within a tolerance (step 116).

Then, an addition limit capacitance value corresponding to the tolerance of the timing is calculated (step 117).

Thereafter, a capacitance value to be added is calculated and the width, length and path of a signal wiring are corrected, and a signal wiring capacitance is thus corrected (Step 118).

Thus, the correction can be easily carried out. In the floor plan stage, the degree of freedom for changing various information is high and the correction can be carried out more easily than that in a layout stage.

Embodiment 9

While the methods of correcting an inductance and a capacitance have been described in the seventh and eighth embodiments, description will be given, as a ninth embodiment of the invention, a method of carrying out an EMI estimation based on equivalent impedance information obtained by EMI noise analyzing means and correcting a resistance based on the EMI estimation.

Figure 12:
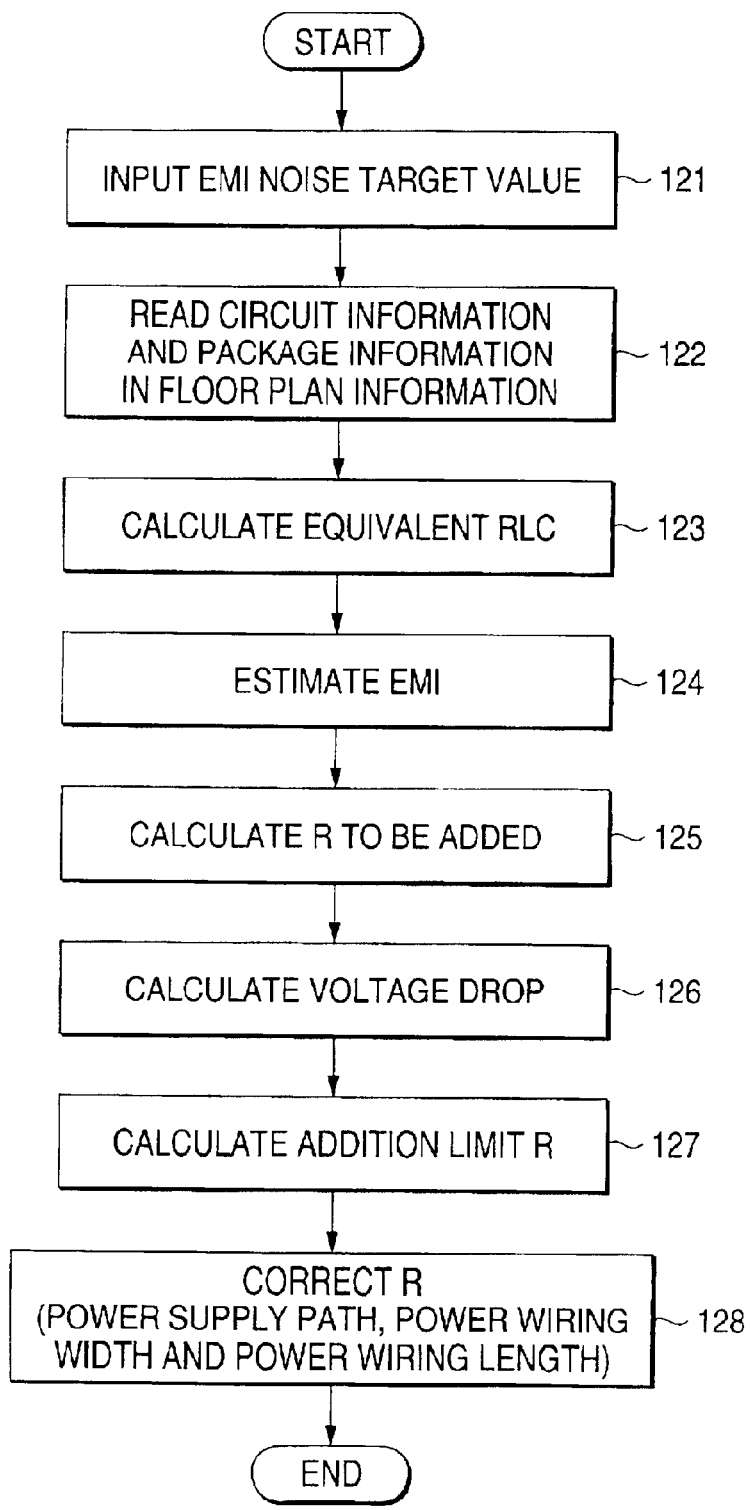
FIG. 12 is a flow chart showing an electromagnetic interference analysis method according to a ninth embodiment of the invention.

As shown in FIG. 12, a processing from a step 121 of inputting a target value of an EMI noise to a step 124 of estimating the EMI noise is the same as that of each of the seventh and eighth embodiments. In this example, a resistance is added in order to obtain the target value of the EMI noise.

First of all, the target value of the EMI noise is input (step 121).

By using the equivalent impedance estimating means 13 shown in FIG. 1 (or by using the method according to each of the embodiments), then, circuit information 11 and package information 12 in a floor plan stage are read (step 122), and a calculation is carried out based on these information to estimate an equivalent impedance (step 123).

Thereafter, an EMI is estimated from the equivalent impedance to obtain an estimated EMI noise in a desirable frequency band (step 124).

Subsequently, the estimated EMI noise is compared with the EMI noise target value which has already been input at the step 121 to calculate a resistance value to be added (step 125).

Next, a voltage drop is calculated in the case in which a resistance addition for obtaining the required resistance value is carried out, and it is decided whether or not the voltage drop ranges are within a tolerance (step 126).

Then, such an addition limit resistance value that the voltage drop ranges within the tolerance is calculated (step 127).

A resistance value to be added is calculated and the width, length and path of a power wiring are corrected, and the resistance value is corrected by a power wiring (Step 128).

Thus, the correction can be easily carried out. In the floor plan stage, the degree of freedom for changing various information is high and the correction can be carried out more easily than that in a layout stage.

Embodiment 10

While the methods of correcting an inductance, a capacitance and a resistance value have been described in the seventh, eighth and ninth embodiments, description will be given, as a tenth embodiment of the invention, a method of carrying out an EMI estimation based on equivalent impedance information obtained by EMI noise analyzing means and performing a correction through a decoupling capacitance addition using a vacancy based on the EMI estimation.

Figure 13:
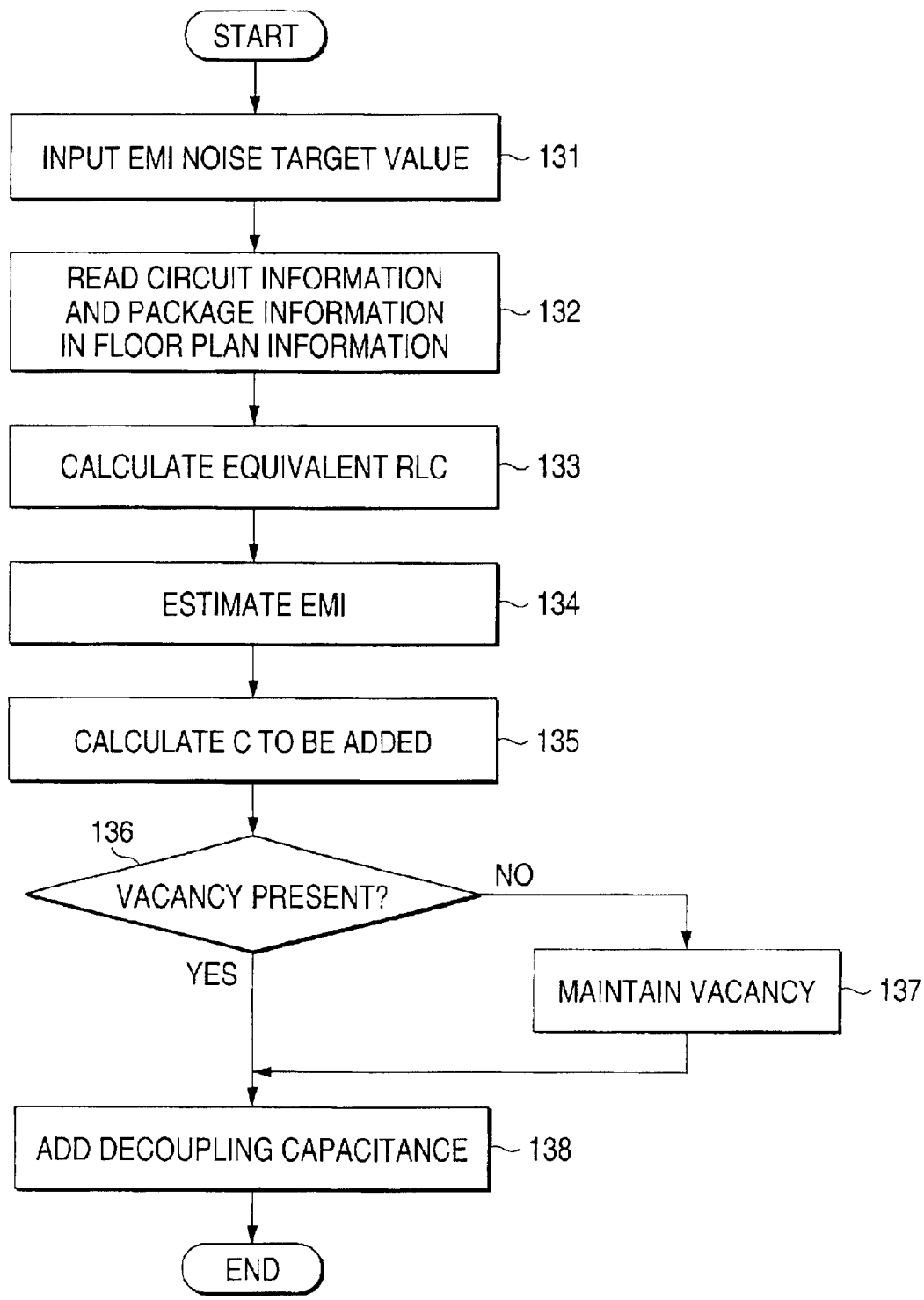
FIG. 13 is a flow chart showing an electromagnetic interference analysis method according to a tenth embodiment of the invention.

As shown in FIG. 13, a processing from a step 131 of inputting a target value of an EMI noise to a step 134 of estimating the EMI noise is the same as that of each of the seventh to ninth embodiments. In this example, a resistance is added in order to obtain the target value of the EMI noise.

First of all, the target value of the EMI noise is input (step 131).

By using the equivalent impedance estimating means 13 shown in FIG. 1 (or by using the method according to each of the embodiments), then, circuit information 11 and package information 12 in a floor plan stage are read (step 132), and a calculation is carried out based on these information to estimate an equivalent impedance (step 133).

Thereafter, an EMI is estimated from the equivalent impedance to obtain an estimated EMI noise in a desirable frequency band (step 134).

Subsequently, the estimated EMI noise is compared with the EMI noise target value which has already been input at the step 131 to calculate a capacitance value to be added (step 135).

Next, it is decided whether or not a vacancy for forming the required capacitance is present (step 136). If the vacancy is present, a decoupling capacitance is added (step 138).

On the other hand, if the vacancy is not present, a vacancy for adding the decoupling capacitance is maintained (step 137) and the decoupling capacitance is added thereto (step 138).

Thus, the correction can be easily carried out. In the floor plan stage, the degree of freedom for changing various information is high and the correction can be carried out more easily than that in a layout stage.

Embodiment 11

At the steps carried out hitherto, the equivalent impedance information calculating step is executed based on the circuit information in the floor plan stage, and it is apparent that the equivalent impedance information calculating step can also be executed based on the circuit information in the layout stage to calculate the EMI noise. Description will be given to an example in which equivalent impedance information is calculated based on circuit information (layout data) in the layout stage.

Figure 14:
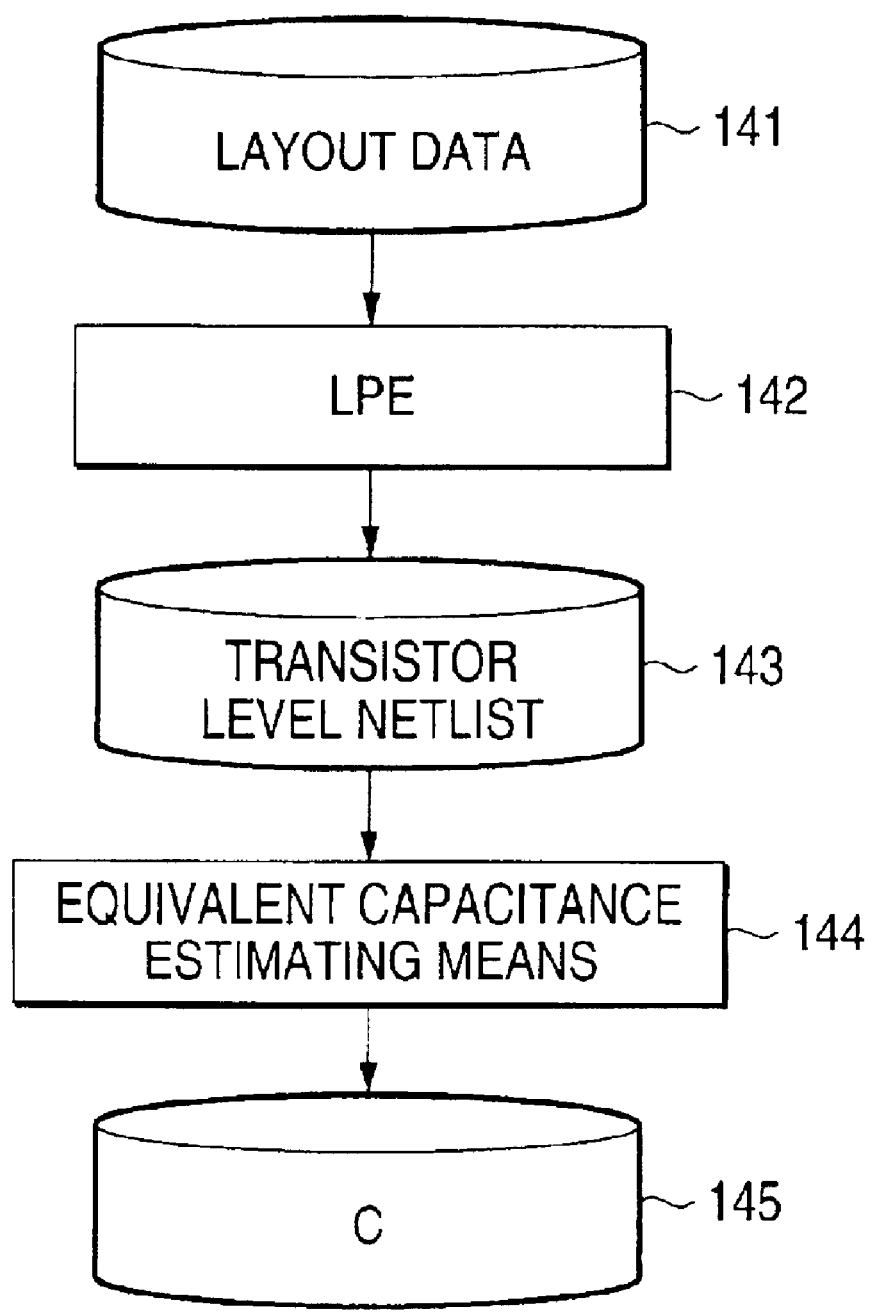
FIG. 14 is a diagram showing an electromagnetic interference analysis method according to an eleventh embodiment of the invention.
Figure 15:
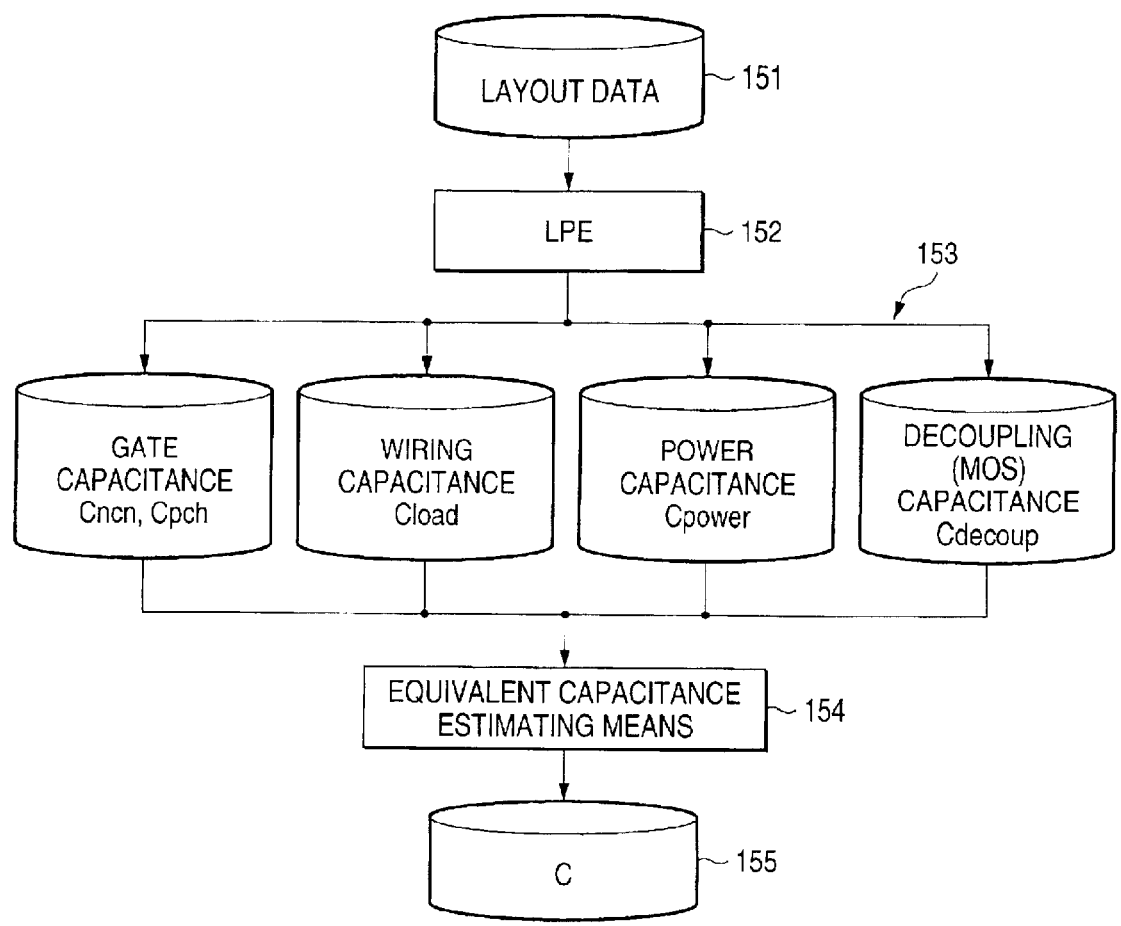
FIG. 15 is a diagram showing an electromagnetic interference analysis apparatus according to the eleventh embodiment of the invention.

FIG. 14 is a flow chart and FIG. 15 shows an EMI analysis apparatus to be used herein. The apparatus includes LPE means 152 for carrying out a layout element extraction LPE from layout data 151, and equivalent capacitance estimating means 154 for estimating, based on the extracted data, an equivalent capacitance including a gate capacitance ($C_{nch}$ and $C_{pch}$), a wiring capacitance ($C_{load}$), a power capacitance ($C_{power}$) and an MOS capacitance (a power supply and a ground are directly connected to each other through an MOS gate: a decoupling capacitance $C_{decoup}$), and serves to estimate an equivalent capacitance C (step 155).

Next, description will be given to an analysis method using an EMI analysis apparatus. As shown in FIG. 14, the layout element extraction LPE is carried out based on layout data 141 (step 142), and a transistor level netlist 143 is obtained based on the extracted data.

An equivalent capacitance 145 is estimated by using equivalent capacitance estimating means 144.

The capacitance is classified into the gate capacitance ($C_{nch}$ and $C_{pch}$), the wiring capacitance ($C_{load}$), the power capacitance ($C_{power}$) and the MOS capacitance (the decoupling capacitance $C_{decoup}$).

A dielectric constant and a gate oxide film thickness are acquired from process information and a gate length and a gate width other than the decoupling capacitance are obtained, and the gate capacitance ($C_{nch}$ and $C_{pch}$) is calculated in an operation expression of "(gate length L)×(gate width W)×(dielectric constant)/(gate oxide film thickness)".

Moreover, a capacitance other than a power—ground capacitance is added up from a netlist on a transistor level generated by the LPE to obtain the wiring capacitance ($C_{load}$).

Furthermore, the power—ground capacitance is added up from the netlist on the transistor level generated by the LPE to obtain the power capacitance ($C_{power}$).

The sum of (length×width) of the decoupling capacitance element is calculated from the netlist on the transistor level generated by the LPE and a capacitance is thereby calculated from a film thickness. The capacitance is calculated in the operation expression of "(gate length L)×(gate width W)×(dielectric constant)/(gate oxide film thickness)".

Thus, it is possible to estimate an equivalent impedance with high precision based on the layout data.

For a capacitance estimation, a capacitance is calculated in accordance with the following expression in consideration of a serial coefficient $\alpha$ and an activation ratio $\beta$.

$$(\alpha(\Sigma Cpch(\text{nofix}) + \Sigma Cnch(\text{nofix})/2 + Cpch(\text{offfix}) + Cnch(\text{offfix})) + \Sigma C\text{load}/2) \times (1-\beta) + C\text{power} + C\text{decoup}$$

While the netlist on the transistor level is LPE extracted in the embodiment, it is also possible to extract a netlist on a gate level. In that case, it is preferable that the gate capacitance and the MOS capacitance should be given with a capacitance Lib of a cell.

Embodiment 12

While the equivalent impedance is estimated with high precision based on the layout data in the embodiment, it is also possible to estimate the equivalent impedance from a schematic netlist on a transistor level. The schematic indicates a layout pre-stage in which only a connecting relationship is determined in a circuit diagram stage.

Figure 16:
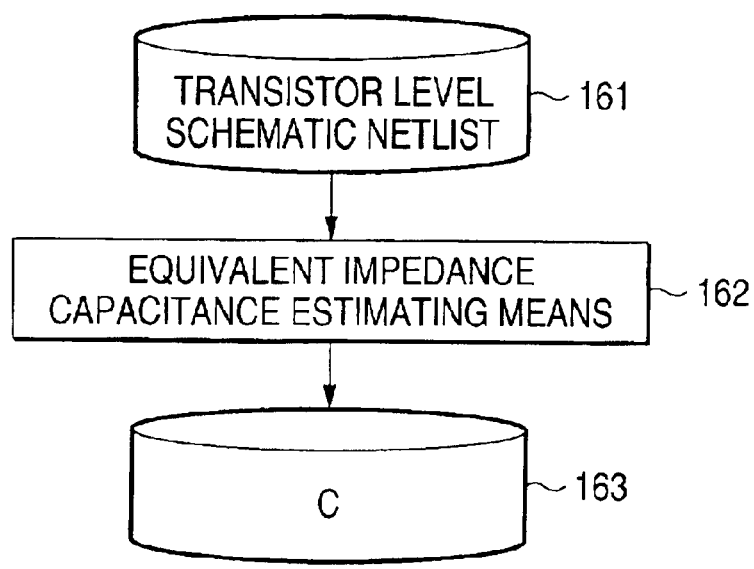
FIG. 16 is a diagram showing an electromagnetic interference analysis apparatus according to a twelfth embodiment of the invention.

As shown in FIG. 16, the apparatus includes a transistor level schematic netlist 161 and capacitance estimating means 162 for estimating an equivalent impedance capacitance from the transistor level schematic netlist 161, and serves to estimate an equivalent capacitance C (163).

Next, description will be given to a method of estimating each capacitance by the capacitance estimating means 162.

First of all, a capacitance is classified into a gate capacitance ($C_{nch}$ and $C_{pch}$), a wiring capacitance ($C_{load}$), a power capacitance ($C_{power}$) and an MOS capacitance (a decoupling capacitance $C_{patgen}$).

The sum of length×width of a gate other than the decoupling capacitance transistor which is directly connected to a power supply and a ground through the gate is calculated from the schematic netlist on the transistor level, and the gate capacitance ($C_{nch}$ and $C_{pch}$) is thereby calculated in the operation expression of "(gate length L)×(gate width W)× (dielectric constant)/(gate oxide film thickness)".

Moreover, a capacitance for each net ((a capacitance other than a power)−(ground capacitance)) is estimated and added up from a wire load model to obtain the wiring capacitance ($C_{load}$).

By setting a chip size, a process type and a power wiring specification as parameters, furthermore, the power and ground capacitance is added up based on statistical data to obtain the power capacitance ($C_{power}$).

The capacitance is calculated from the sum of (gate length×width W) in a decoupling MOS capacitance transistor connected directly to a power supply and a ground through a gate and a film thickness, the number of the decoupling MOS capacities to be inserted or an area in which the decoupling MOS capacitance can be inserted. Thus, the MOS capacitance $C_{decoup}$ is obtained.

Thus, it is possible to easily estimate an equivalent impedance from the schematic netlist on the transistor level.

In this method, an LPE processing is not required. Therefore, it is possible to obtain the effect of easily estimating an equivalent impedance. Moreover, it is possible to obtain the effect of estimating an equivalent impedance without waiting for the completion of a layout. Furthermore, the equivalent impedance determined from a circuit design can be quantified. Consequently, it is possible to carry out an EMI optimization based on the circuit design.

Embodiment 13

While the equivalent impedance is estimated based on the schematic netlist on the transistor level in the embodiment, it is also possible to estimate an equivalent impedance from a schematic netlist on a gate level.

Figure 17:
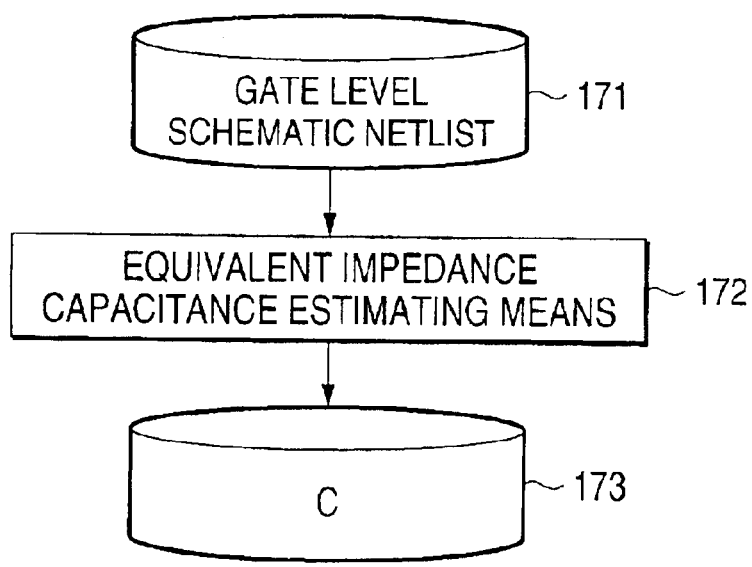
FIG. 17 is a diagram showing an electromagnetic interference analysis apparatus according to a thirteenth embodiment of the invention.

The apparatus includes a gate level schematic netlist 171 and capacitance estimating means 172 for estimating an equivalent impedance capacitance from the gate level schematic netlist 171, and serves to estimate an equivalent capacitance C (173) as shown in FIG. 17.

Also in this method, an LPE processing is not required. Therefore, it is possible to obtain the effect of easily estimating an equivalent impedance. Moreover, it is possible to obtain the effect of estimating an equivalent impedance without waiting for the completion of a layout. Furthermore, an equivalent impedance determined by a circuit design can be quantified. Therefore, it is possible to carry out an EMI optimization based on the circuit design.

In addition, the estimation is carried out on the gate level. Therefore, it is possible to calculate an equivalent impedance adapted to an LSI design phase.

Embodiment 14

While all the gate capacities of a transistor are calculated as capacities for the capacitance estimation in the embodiment, the gate capacitance and a source-drain capacitance act as the capacities depending on their potential difference. In other words, they do not act as the capacities with the same electric potential. For this reason, it is necessary to actually correct the capacities.

Figure 18:
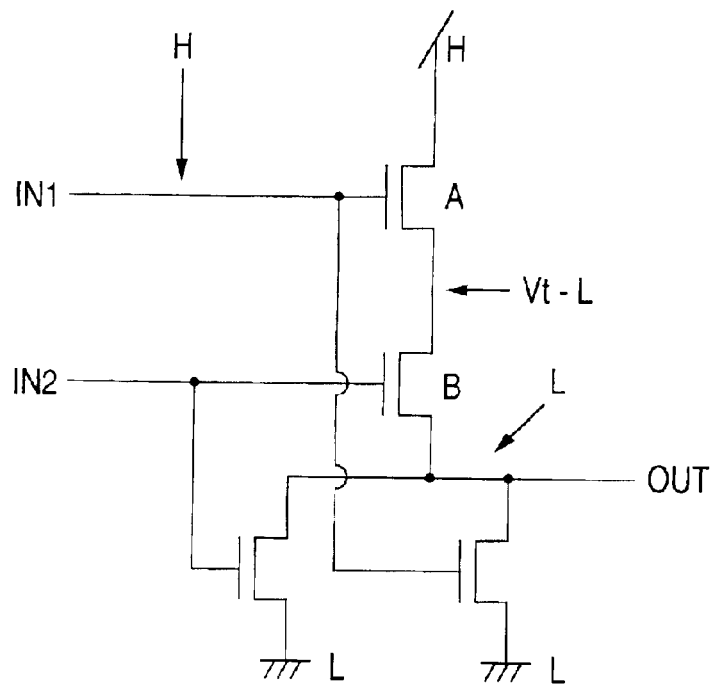
FIG. 18 is a diagram showing an electromagnetic interference analysis method according to a fourteenth embodiment of the invention.

More specifically, in the case in which H is input to an input signal IN1 as shown in FIG. 18, the source-drain potential of a transistor B is not set to be H. Therefore, the capacitance does not linearly act irrespective of the gate potential of the transistor B. Therefore, a serial coefficient a is introduced as a coefficient which considers an increase in a probability that a transistor provided on the distant side from a power and ground in a serial connection state might not linearly function as the gate capacitance, and a capacitance value is thus corrected. It is preferable that a unit for calculating the serial coefficient such as a cell unit or a library unit should be treated as a proper unit in consideration of a man-hour and a trade-off in precision.

Furthermore, a capacitance value is calculated separately for a transistor having an apparent gate capacitance value with a gate potential fixed to a power supply and a ground and a decoupling ratio γ is introduced as a coefficient for a transistor in which a gate potential is not defined, and a capacitance is thus estimated. Thus, it is possible to implement an estimation with higher precision.

Moreover, a transistor which is being operated is to be excluded from the gate capacitance. Therefore, an activation ratio β is introduced as a coefficient indicating whether or not the transistor is being operated. Thus, the capacitance value is corrected.

The following expression is taken as an example in which the serial coefficient α, the decoupling ratio γ and the activation ratio β are considered for the capacitance estimation.

$$[[(C_{nch}+C_{pch})\times 0.1 \times \alpha + (C_{nch}+C_{pch}) \times (1-\alpha)] + C_{load}] \times \beta \times \gamma + C_{power} + C_{decoup}$$

In this expression, 0.1 is temporarily given in order to cause the gate capacitance of a serial connection to effectively act as a capacitance. In this case, 10% of a capacitance to be estimated from a gate area effectively acts as a capacitance. This numeric value can be obtained as process information.

Consequently, it is possible to carry out an equivalent impedance estimation with higher precision.

Embodiment 15

While the equivalent impedance is estimated based on the schematic netlist on the transistor level in the embodiment, a memory element such as an RAM memory may be treated as a block to estimate a decoupling capacitance, thereby estimating an equivalent capacitance.

Figure 19:
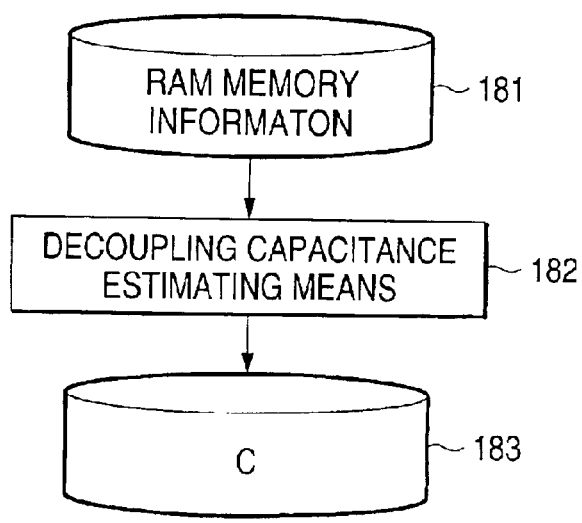
FIG. 19 is a diagram showing an electromagnetic interference analysis apparatus according to a fifteenth embodiment of the invention.

The apparatus includes RAM memory information 181 and decoupling capacitance estimating means 182 for estimating a decoupling capacitance from the RAM memory information 181, and serves to estimate an equivalent capacitance C (183) as shown in FIG. 19.

Consequently, it is possible to easily carry out an equivalent capacitance estimation with higher precision.

Embodiment 16

Next, description will be given to a method of considering the operation/non-operation of a cell from a dynamic analysis.

The activation ratio of an impedance calculation expression is caused to fluctuate dynamically to be a variable capacitance. Thus, precision can be enhanced.

Figure 20:
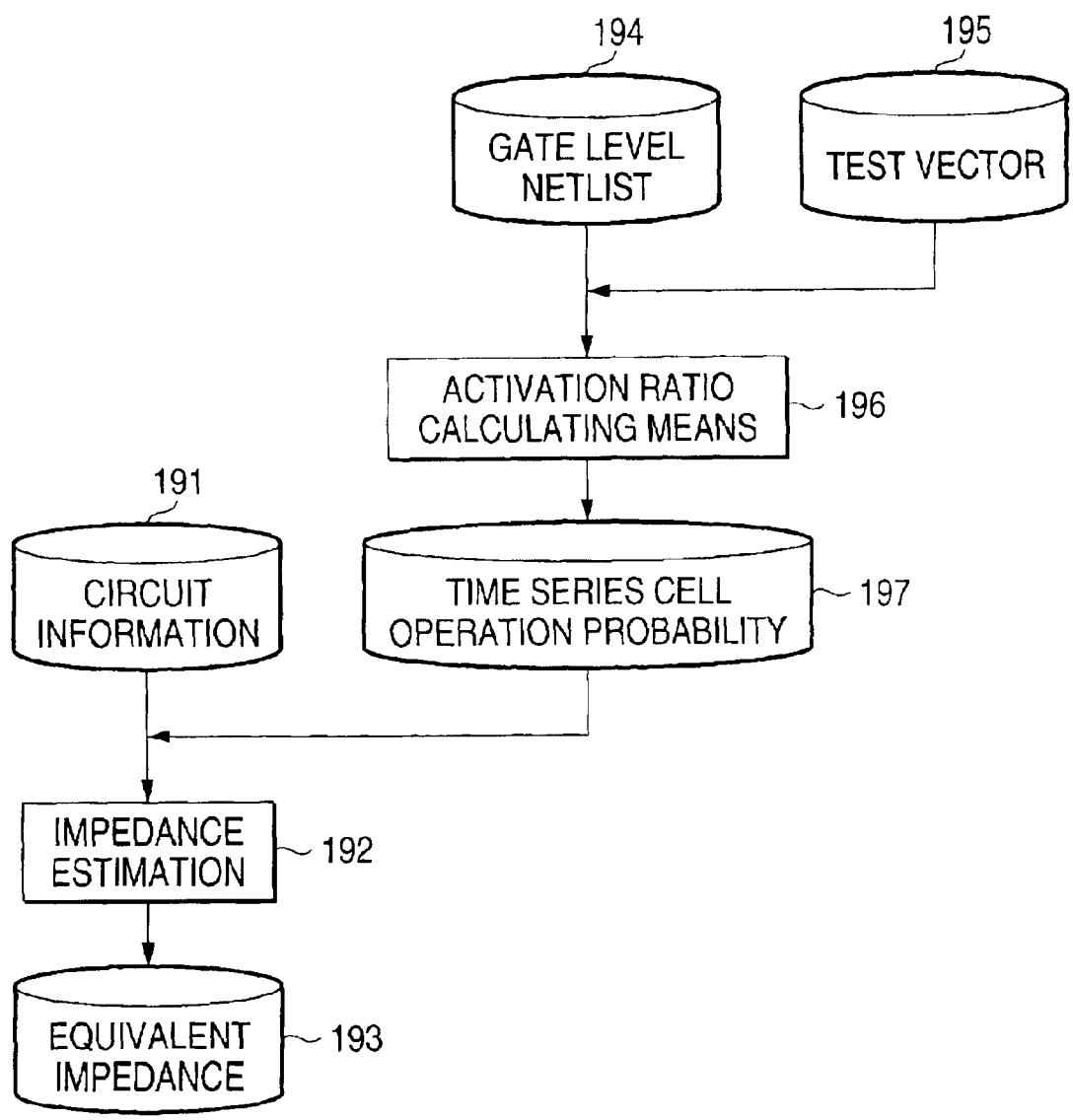
FIG. 20 is a diagram showing an electromagnetic. interference analysis apparatus according to a sixteenth embodiment of the invention.

The apparatus includes activation ratio calculating means 196 for calculating an activation ratio from a gate level netlist 194 and a test vector 195 and serves to obtain the operation probability of the cell herein (step 197) and to estimate an impedance from the operation probability and circuit information 191 by impedance estimating means 192 as shown in FIG. 20.

According to this method, the activation ratio of the impedance calculating expression is caused to fluctuate dynamically to be a variable capacitance. Consequently, it is possible to enhance precision.

Embodiment 17

While the method of considering the operation/non-operation of the cell with the activation ratio from the dynamic analysis has been mentioned in the embodiment, description will be given to an apparatus for carrying out a calculation through a probability propagation.

Figure 21:
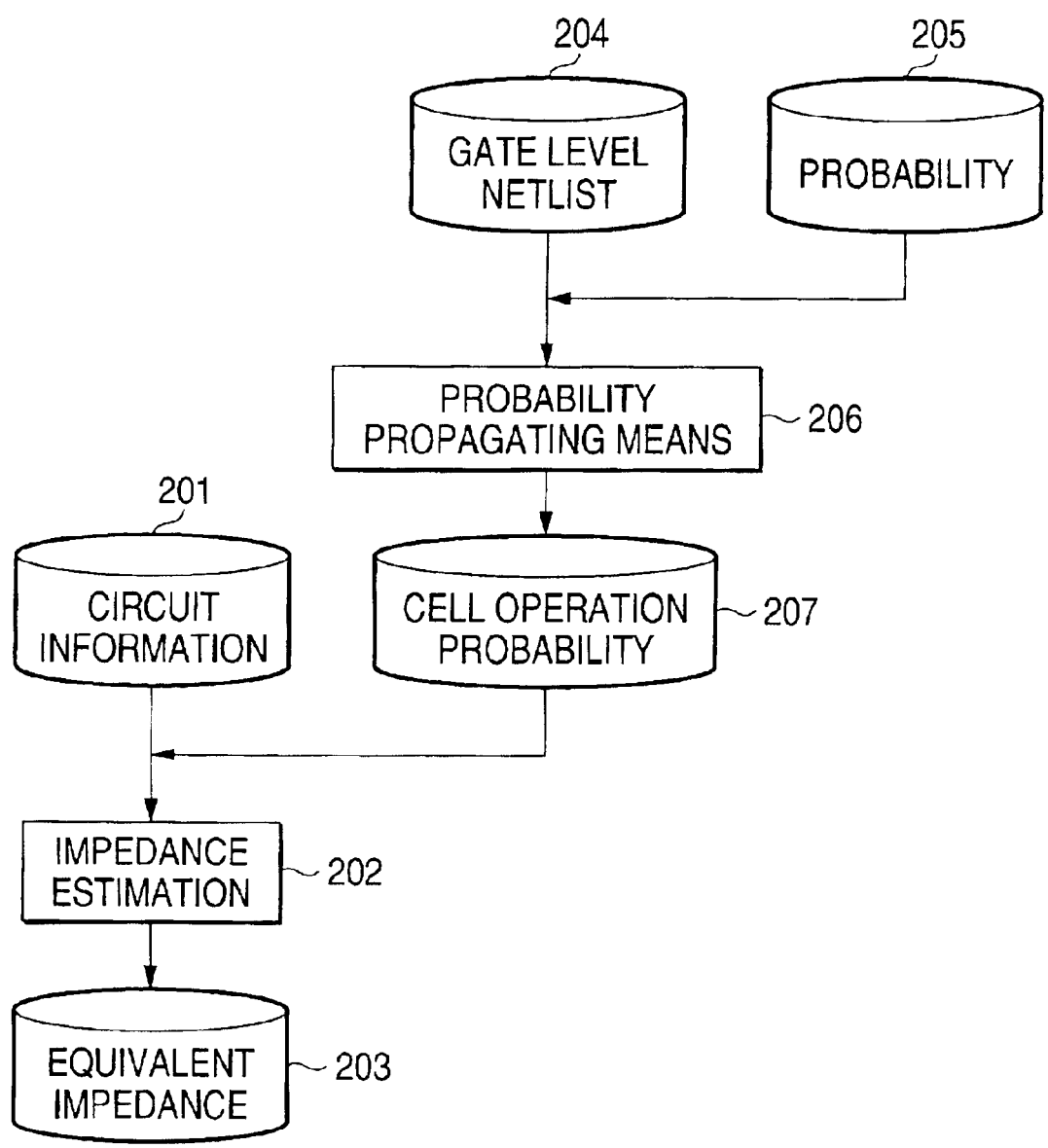
FIG. 21 is a diagram showing an electromagnetic interference analysis apparatus according to a seventeenth embodiment of the invention.

The apparatus includes probability propagating means 206 for calculating the propagation ratio of a probability from a gate level netlist 204 and probability information 205, and serves to obtain the operation probability of a cell herein (step 207) and to estimate an impedance from the operation probability and circuit information 201 by impedance estimating means 202 (step 203) as shown in FIG. 21.

According to the method, the activation ratio of an impedance calculating expression is estimated in consideration of the probability propagation. Therefore, it is possible to further enhance precision.

Embodiment 18

Description will be given to a method of estimating a resistance based on circuit information in a layout stage.

Figure 22:
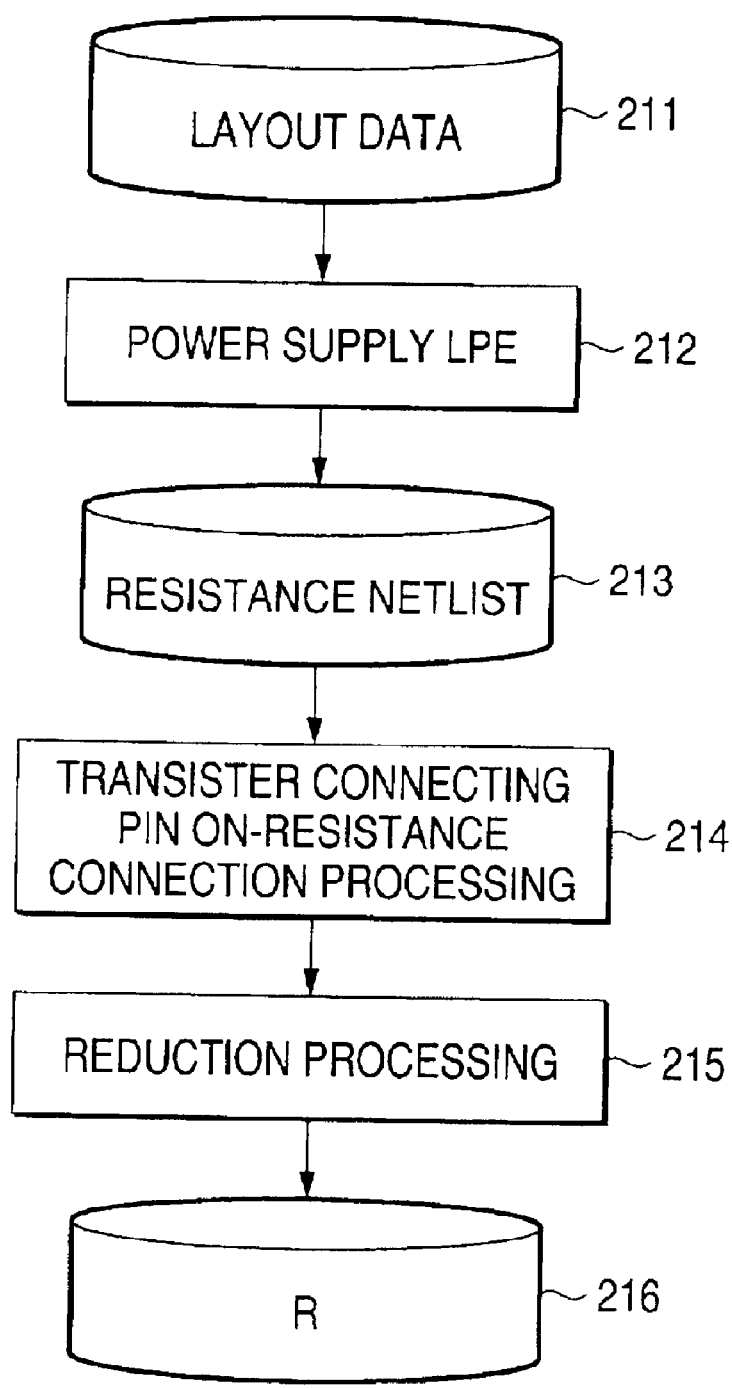
FIG. 22 is a diagram showing an electromagnetic interference analysis apparatus according to an eighteenth embodiment of the invention.

FIG. 22 shows an EMI analysis apparatus to be used therein. The apparatus includes LPE means 212 for carrying out a layout element extraction LPE from layout data 211, and generates a resistance netlist 213 based on the extracted data, carries out an equivalent processing on the assumption that a transistor connecting terminal is connected through a resistor (an ON-state resistor or a cutoff resistor) (Step 214), and calculates an equivalent resistance 216 by a reduction or by calculating a current amount for a power supply (step 215).

Also in the apparatus, it is possible to estimate an equivalent resistance with high precision.

Embodiment 19

Next, description will be given to the estimation of a source resistance to be carried out when only a power layout is completed.

It is assumed that the source resistance is estimated to be approximately half of a main line.

Figure 23:
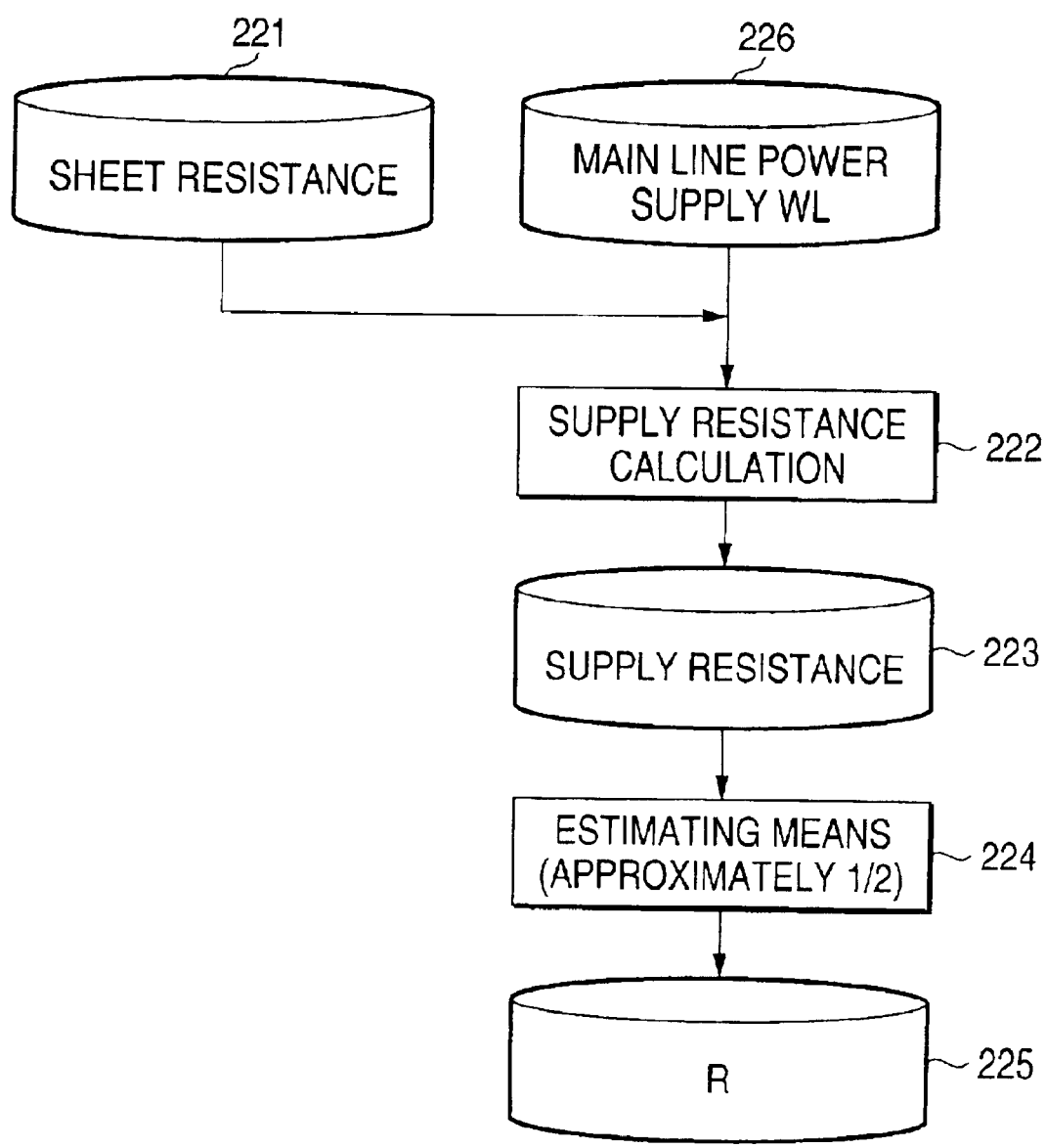
FIG. 23 is a diagram showing an electromagnetic interference analysis method according to a nineteenth embodiment of the invention.

FIG. 23 shows an EMI analysis apparatus to be used therein. The apparatus serves to obtain a sheet resistance 221 from the layout data of a power supply, and the length and width of a main line power supply (226). Then, a source resistance 223 is calculated (step 222). Thereafter, a coefficient (½ herein) is multiplied to estimate an equivalent resistance R225 (step 224).

Thus, it is possible to efficiently estimate a resistance with high precision.

Embodiment 20

As a twentieth embodiment of the invention, description will be given to a method of carrying out an EMI estimation based on equivalent impedance information obtained by EMI noise analyzing means performing an estimation based on layout information and of executing a correction based on the EMI estimation. The embodiment is the same as the correction in the floor plan stage described in the seventh to eleventh embodiments and is different in that layout information is read and an equivalent impedance is estimated based on the layout information, and has such a feature that the estimation can be carried out with high precision.

Figure 24:
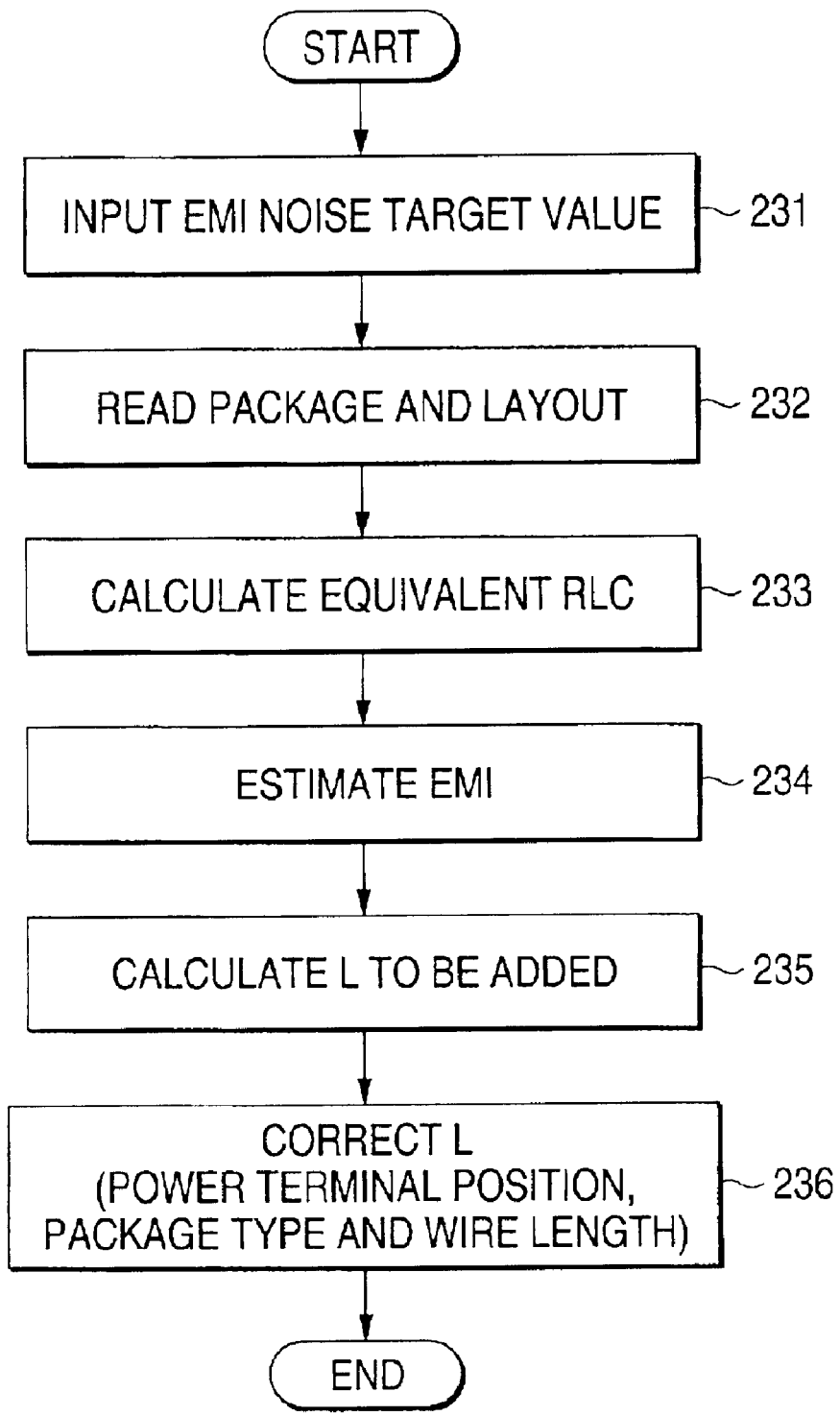
FIG. 24 is a flow chart showing an electromagnetic interference analysis method according to a twentieth embodiment of the invention.

In this example, as shown in FIG. 24, the target value of an EMI noise is first input (step 231).

By using the equivalent impedance estimating means 13 shown in FIG. 1 (or by using the method according to each of the embodiments), then, circuit information 11 and package information 12 in a layout stage are read (step 232), and an equivalent impedance is calculated based on the value to estimate an equivalent impedance (step 233).

Thereafter, an EMI is estimated from the equivalent impedance to obtain an estimated EMI noise in a desirable frequency band (step 234).

Subsequently, the estimated EMI noise is compared with the EMI noise target value which has already been input at the step 231 to calculate an inductance to be added (step 235).

Next, a power terminal position, a package type and a wire length for obtaining the required inductance are calculated, and a correction is carried out on a layout level (step 236).

Thus, the correction can be easily carried out. Although the degree of freedom is lower than that of a correction to be carried out in a floor plan stage, the correction can be carried out with high precision.

Embodiment 21

While the method of carrying out the inductance correction has been described in the twentieth embodiment, description will be given, as a twenty-first embodiment of the invention, a method of carrying out an EMI estimation based on equivalent impedance information obtained by EMI noise analyzing means and performing a signal wiring capacitance correction based on the EMI estimation.

Figure 25:
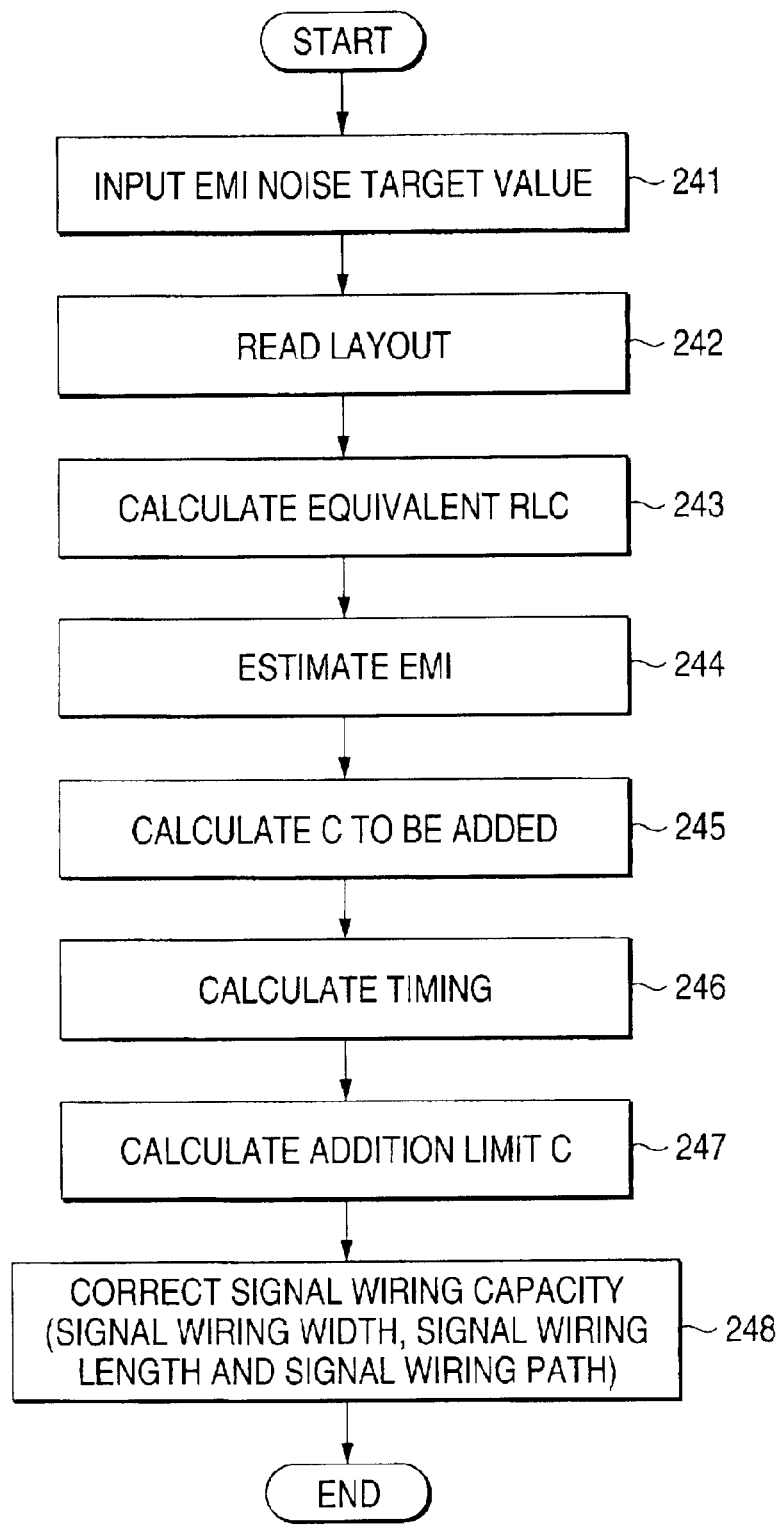
FIG. 25 is a flow chart showing an electromagnetic interference analysis method according to a twenty-first embodiment of the invention.

As shown in FIG. 25, a processing from a step 241 of inputting a target value of an EMI noise to a step 244 of estimating the EMI noise is just the same as that of the twentieth embodiment. In this example, a signal wiring capacitance addition is carried out in order to obtain the target value of the EMI noise.

First of all, the target value of the EMI noise is input (step 241).

By using the equivalent impedance estimating means 13 shown in FIG. 1 (or by using the method according to each of the embodiments), then, circuit information 11 and package information 12 in a layout stage are read (step 242), and a calculation is carried out based on these information to estimate an equivalent impedance (step 243).

Thereafter, an EMI is estimated from the equivalent impedance to obtain an estimated EMI noise in a desirable frequency band (step 244).

Subsequently, the estimated EMI noise is compared with the EMI noise target value which has already been input at the step 241 to calculate a capacitance value to be added (step 245).

In the case in which a capacitance addition for obtaining the required capacitance value is carried out, the amount of delay of a timing is calculated and it is decided whether or not the delay ranges within a tolerance (step 246).

Then, an addition limit capacitance value corresponding to the tolerance of the timing is calculated (step 247).

Thereafter, a capacitance value to be added is calculated and the width, length and path of a signal wiring are corrected, and a signal wiring capacitance is thus corrected (Step 248).

According to such a structure, it is preferable that the signal wiring capacitance should be corrected to have no timing delay, and an optimization can be easily carried out efficiently.

Thus, the correction can be easily carried out. Although the degree of freedom is lower than that of a correction to be carried out in a floor plan stage, the correction can be performed with high precision.

Embodiment 22

While the methods of correcting an inductance and a capacitance have been described in the twentieth and twenty-first embodiments, description will be given, as a twenty-second embodiment of the invention, a method of carrying out an EMI estimation based on equivalent impedance information obtained by EMI noise analyzing means and correcting a resistance based on the EMI estimation.

Figure 26:
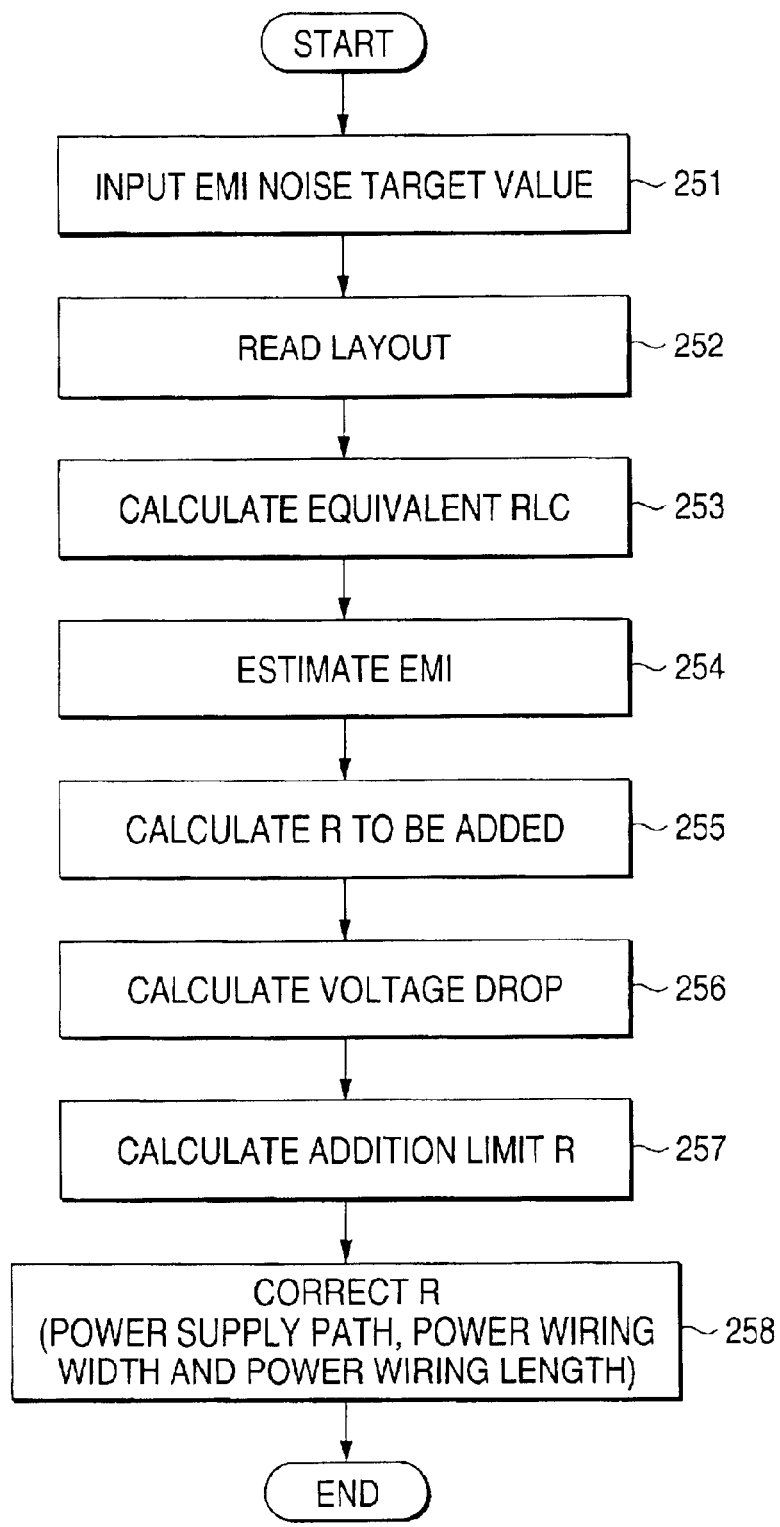
FIG. 26 is a flow chart showing an electromagnetic interference analysis method according to a twenty-second embodiment of the invention.

As shown in FIG. 26, a processing from a step 251 of inputting a target value of an EMI noise to a step 254 of estimating the EMI noise is just the same as that of each of the twentieth and twenty-first embodiments. In this example, a resistance is added in order to obtain the target value of the EMI noise.

First of all, the target value of the EMI noise is input (step 251).

By using the equivalent impedance estimating means 13 shown in FIG. 1 (or by using the method according to each of the embodiments), then, circuit information 11 and package information 12 in a floor plan stage are read (step 252), and an equivalent RLC calculation is carried out based on these information to estimate an equivalent impedance (step 253).

Thereafter, an EMI is estimated from the equivalent impedance to obtain an estimated EMI noise in a desirable frequency band (step 254).

Subsequently, the estimated EMI noise is compared with the EMI noise target value which has already been input at the step 251 to calculate a resistance value to be added (step 255).

Next, a voltage drop is calculated in the case in which a resistance addition for obtaining the required resistance value is carried out, and it is decided whether or not the voltage drop ranges within a tolerance (step 256).

Then, such an addition limit resistance value that the voltage drop ranges within the tolerance is calculated (step 257).

Thereafter, a resistance value to be added is calculated and the width, length and path of a power wiring are corrected, and the resistance value is corrected by the power wiring (Step 258).

Thus, the correction can be easily carried out. Although the degree of freedom is lower than that of a correction to be carried out in a floor plan stage, the correction can be performed with high precision.

Embodiment 23

While the methods of correcting an inductance, a wiring capacitance and a resistance value have been described in the twentieth, twenty-first and twenty-second embodiments, description will be given, as a twenty-third embodiment of the invention, a method of carrying out an EMI estimation based on equivalent impedance information obtained by EMI noise analyzing means and performing a correction through a decoupling capacitance addition using a vacancy based on the EMI estimation.

Figure 27:
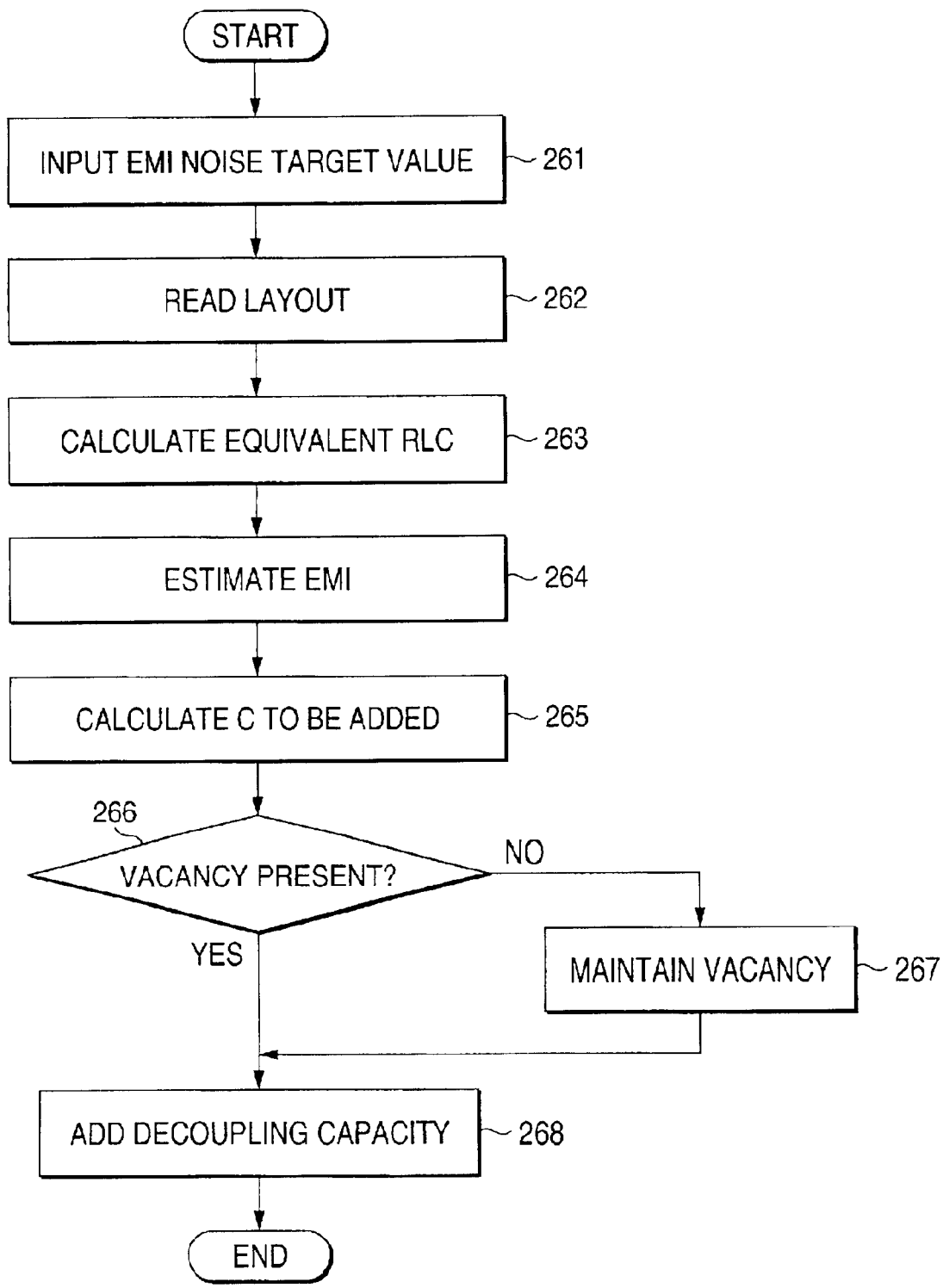
FIG. 27 is a flow chart showing an electromagnetic interference analysis method according to a twenty-third embodiment of the invention.

As shown in FIG. 27, a processing from a step 261 of inputting a target value of an EMI noise to a step 264 of estimating the EMI noise is just the same as that of each of the twenty-first to twenty-third embodiment. In this example, a decoupling capacitance is added in order to obtain the target value of the EMI noise.

First of all, the target value of the EMI noise is input (step 261).

By using the equivalent impedance estimating means 13 shown in FIG. 1 (or by using the method according to each of the embodiments), then, circuit information 11 and package information 12 in a layout stage are read (step 262), and an equivalent RLC calculation is carried out based on these information to estimate an equivalent impedance (step 263).

Thereafter, an EMI is estimated from the equivalent impedance to obtain an estimated EMI noise in a desirable frequency band (step 264).

Subsequently, the estimated EMI noise is compared with the EMI noise target value which has already been input at the step 261 to calculate a capacitance value to be added (step 265).

Next, it is decided whether or not a vacancy for forming the required capacitance is present (step 266). If the vacancy is present, a decoupling capacitance is added (step 268).

On the other hand, if the vacancy is not present, a vacancy for adding the decoupling capacitance is maintained (step 267) and the decoupling capacitance is added thereto (step 269).

Thus, the correction can be easily carried out. Although the degree of freedom is lower than that of a correction to be carried out in a floor plan stage, the correction can be performed with high precision.

Embodiment 24

Next, description will be given to a method of optimizing an equivalent RC to reduce an EMI noise based on an estimation RC.

Figure 28A:
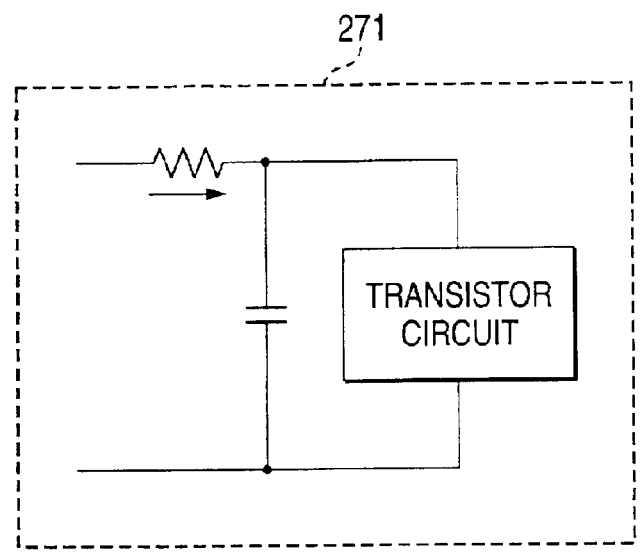
FIGS. 28A and 28B are conceptual diagrams showing an electromagnetic interference analysis method according to a twenty-fourth embodiment of the invention.
Figure 28B:
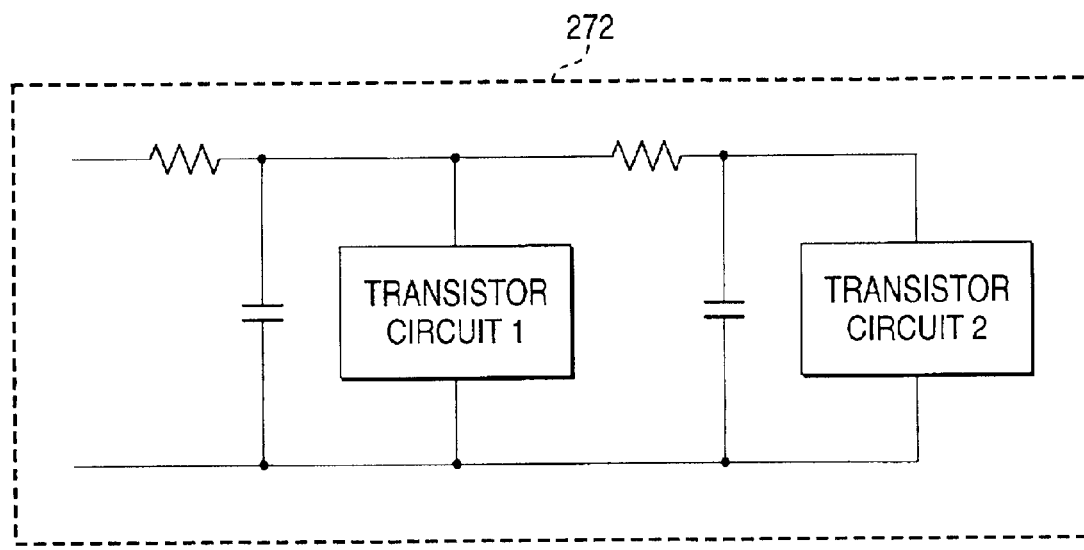

As shown in FIGS. 28A and 28B, a transistor circuit is distributed even if the total capacitance and resistance are equal, and one of them has a noise caused by a capacitance and a resistance seen from the outside.

More specifically, the transistor circuit in FIG. 28A is distributed in FIG. 28B. In this case, the distributed transistor circuit has a smaller EMI noise. The reverse case is possible. By adjusting an array and a combination, a regulation can be realized.

Next, description will be given to a method of carrying out an optimization by performing a rearrangement to reduce the EMI noise based on an estimation RC.

Figure 29:
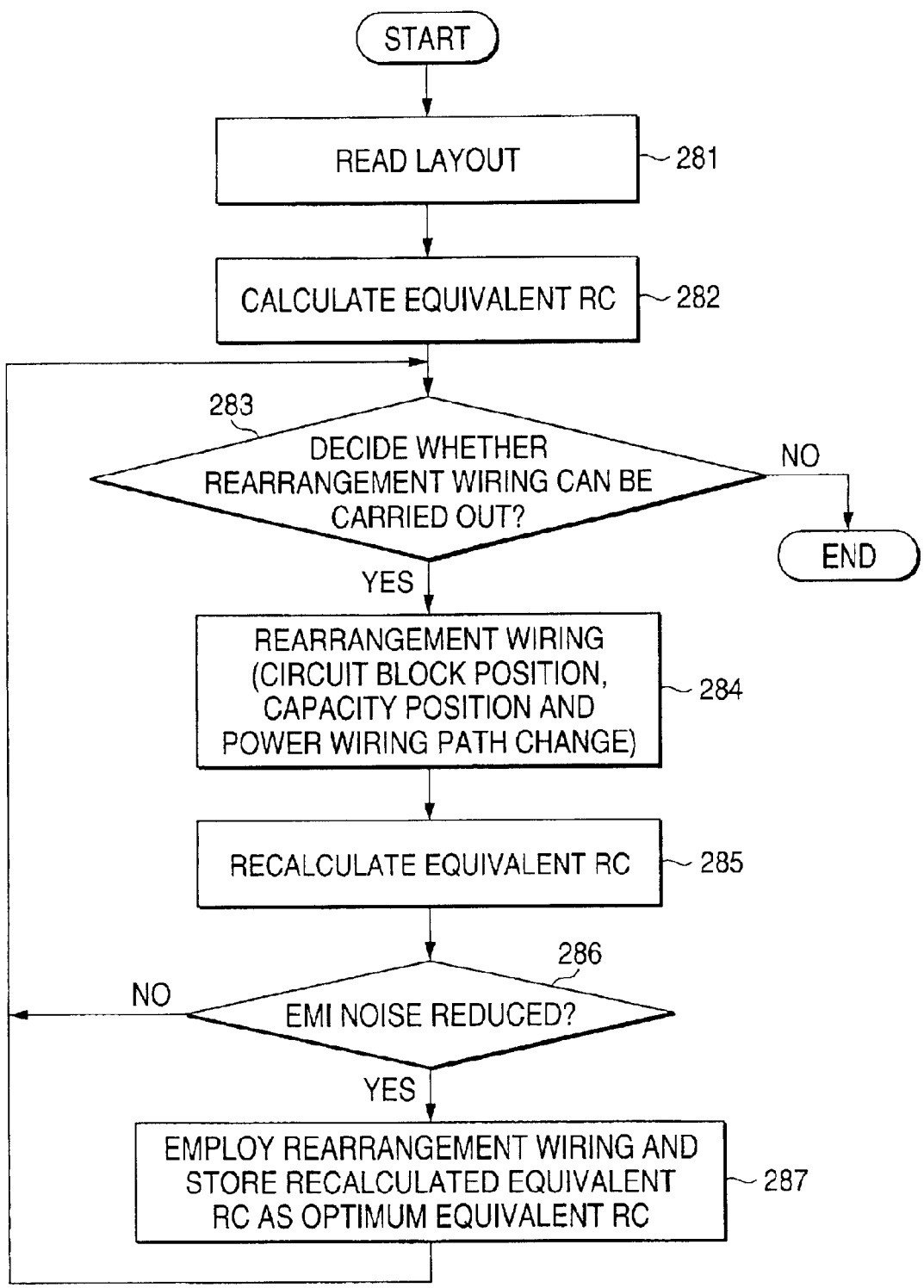
FIG. 29 is a flow chart showing the electromagnetic interference analysis method according to the twenty-fourth embodiment of the invention.
Figure 30:
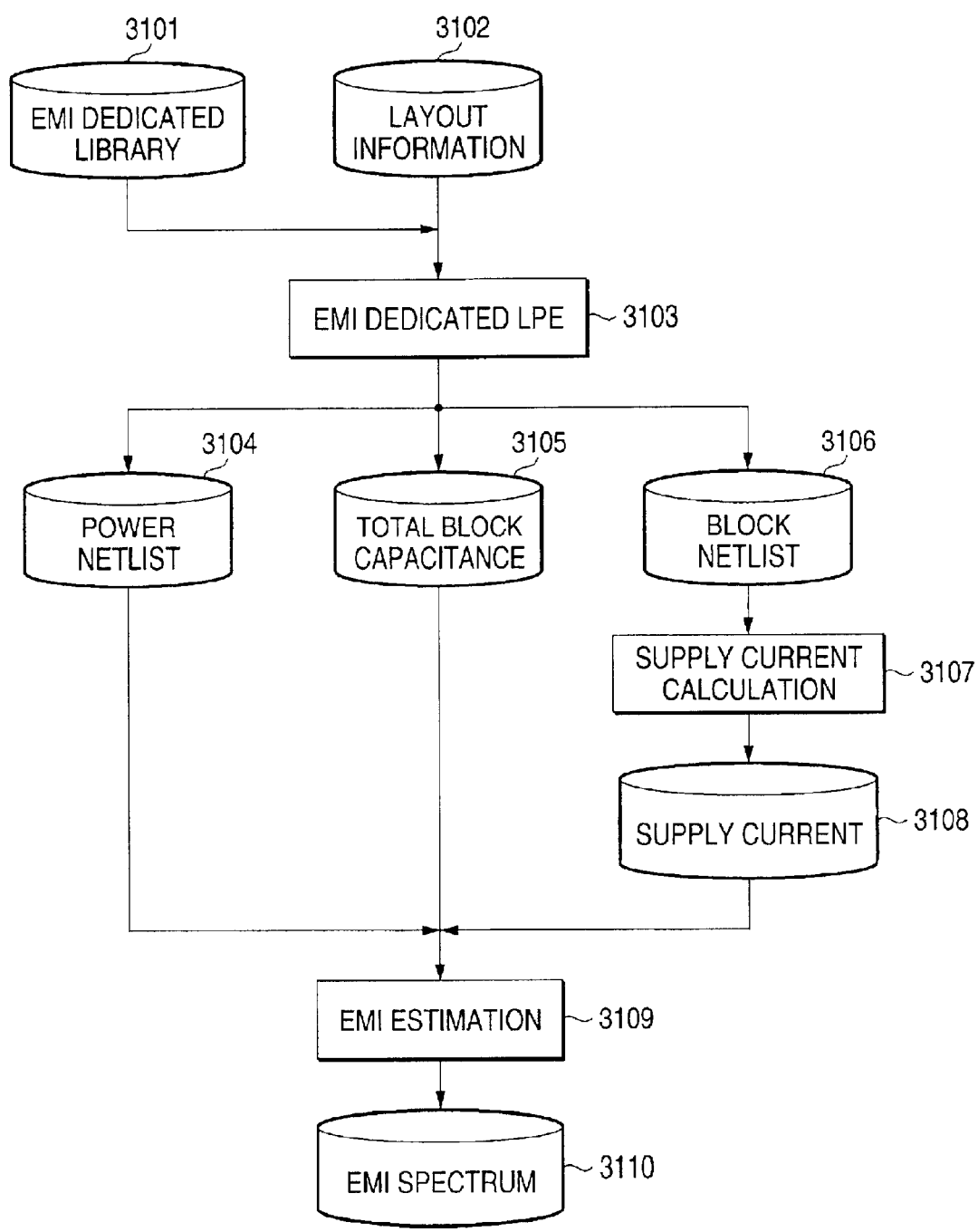
FIG. 30 is a diagram showing an electromagnetic interference analysis method according to a conventional example.
Figure 31:
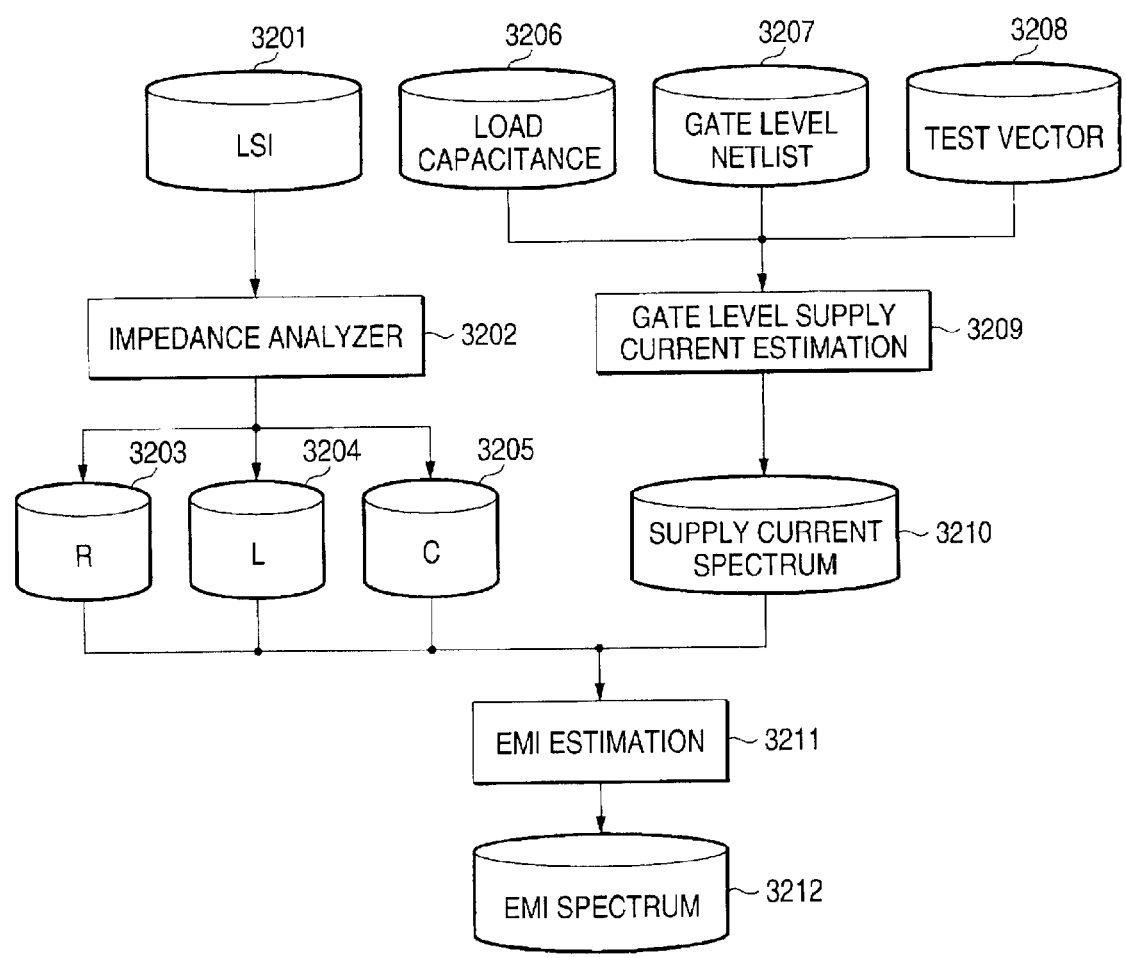
FIG. 31 is a diagram showing the electromagnetic interference analysis method according to the conventional example.

As shown in FIG. 29, first of all, circuit information 11 in a layout stage is read by using the equivalent impedance estimating means 13 shown in FIG. 1 (or by using the method according to each of the embodiments) (step 281), and an equivalent RC is calculated based on the information and an equivalent capacitance and an equivalent resistance are estimated (step 282).

Then, it is decided whether or not a rearrangement wiring can be carried out (step 283). If the rearrangement wiring can be carried out, a circuit block position, a capacitance position and a power wiring path are changed to carry out the rearrangement wiring (step 284).

Thereafter, the equivalent capacitance and the equivalent resistance (equivalent RC) are recalculated and are thus estimated (step 285).

Subsequently, it is decided whether or not the EMI noise is reduced (step 286). If the EMI noise is reduced, it is stored as an optimum equivalent RC (step 287).

If the EMI noise is not reduced, the processing returns to the step 283 again.

Moreover, if it is decided that the rearrangement wiring cannot be carried out at the decision step 283 in which it is decided whether or not the rearrangement wiring can be carried out, the processing is ended.

Thus, the optimization can also be performed.

According to such a structure, equivalent impedance information is calculated from circuit information on a layout level and an electromagnetic interference analysis is carried out based on the value. Therefore, if the electromagnetic interference analysis is to be carried out in such a stage that a layout is once fixed, it is possible to perform the electromagnetic interference analysis with higher precision and higher reliability.

According to the invention, the equivalent impedance information is calculated from circuit information and package information without calculating supply current information from the circuit information of an LSI chip, and a capacitance countermeasure correction is carried out. Therefore, it is possible to easily perform the electromagnetic interference analysis at a high speed. Moreover, the analysis can be thus carried out from only the circuit information in the early stage. Consequently, it is easy to change a chip area, a power supply or a package, and the degree of freedom for taking an electromagnetic interference countermeasure can be increased and the electromagnetic interference can easily be reduced.

By estimating the influence of decoupling based on the resistances, capacities and inductances of a power supply and a ground from the circuit information without the supply current information, it is possible to cause an increase in a speed and an increase in precision to be compatible with each other and to evaluate the electromagnetic interference of an LSI on a simulation in an actual time. Furthermore, it is also possible to take an efficient EMI countermeasure by supporting the specification of a place in which an EMI is generated.

What is claimed is:

1. A method of analyzing an electromagnetic interference amount of an LSI comprising:

an equivalent impedance information calculating step of calculating and estimating equivalent impedance information based on circuit information of an LSI chip and package information of the LSI chip; and an electromagnetic interference noise calculating step of calculating an electromagnetic interference noise based on the equivalent impedance information.

2. The electromagnetic interference analysis method as claimed in claim 1, wherein the equivalent impedance information calculating step comprises:

a first extracting step of extracting a chip area, a power pad position and power supply information from the circuit information; and a second extracting step of extracting a package type from the package information, wherein equivalent impedance information is calculated and estimated based on the information obtained at the first and second extracting steps.

3. The electromagnetic interference analysis method as claimed in claim 1, wherein the circuit information includes floor plan information.

4. The electromagnetic interference analysis method as claimed in claim 1, wherein the circuit information includes layout information.

5. The electromagnetic interference analysis method as claimed in claim 1, wherein the circuit information includes netlist information.

6. The electromagnetic interference analysis method as claimed in claim 5, wherein the netlist information includes circuit information on a function level.

7. The electromagnetic interference analysis method as claimed in claim 5, wherein the netlist information includes circuit information on a gate level.

8. The electromagnetic interference analysis method as claimed in claim 5, wherein the netlist information includes circuit information on a transistor level.

9. The electromagnetic interference analysis method as claimed in claim 1, wherein the equivalent impedance information calculating step comprises a step of estimating a memory block as a capacitance from the circuit information.

10. The electromagnetic interference analysis method as claimed in claim 1, wherein the equivalent impedance information calculating step comprises a step of estimating a capacitance in consideration of an activation ratio.

11. The electromagnetic interference analysis method as claimed in claim 1, wherein the equivalent impedance information calculating step comprises a step of estimating a resistance value from the circuit information.

12. The electromagnetic interference analysis method as claimed in claim 1, wherein the equivalent impedance information calculating step comprises:

extracting circuit connection information from the circuit information;

creating circuit connection information in which an active element is substituted for a predetermined resistance; and calculating an equivalent resistance.

13. The electromagnetic interference analysis method as claimed in claim 1, wherein the equivalent impedance information calculating step comprises a step of estimating a resistance value based on a chip area from the circuit information.

14. The electromagnetic interference analysis method as claimed in claim 1, wherein the equivalent impedance information calculating step comprises:

changing inductance information for a wire length into a database;

calculating the wire length from the circuit information and the package information; and extracting the inductance information changed into the data base from the wire length, whereby estimating an inductance.

15. The electromagnetic interference analysis method as claimed in claim 1, further comprising a noise estimating step of estimating an electromagnetic interference noise based on an equivalent impedance obtained at the equivalent impedance information calculating step.

16. The electromagnetic interference analysis method as claimed in claim 15, wherein the noise estimating step comprises:

calculating a frequency response characteristic of the LSI from the equivalent impedance and the circuit information; and estimating an electromagnetic interference noise of the LSI based on the frequency response characteristic.

17. The electromagnetic interference analysis method as claimed in claim 16, wherein the noise estimating step comprises:

calculating an offset value based on a clock frequency and an estimated consumption power; and multiplying the frequency response characteristic by the offset value.

18. The electromagnetic interference analysis method as claimed in claim 15, further comprising a correcting step of carrying out a correction in order to optimize an electromagnetic interference noise based on the equivalent impedance.

19. The electromagnetic interference analysis method as claimed in claim 18, wherein the correcting step comprises a step of correcting a power terminal position, a package type and a wire length in order to correct an inductance based on the electromagnetic interference noise estimated at the noise estimating step.

20. The electromagnetic interference analysis method as claimed in claim 18, wherein the correcting step comprises a step of correcting a signal wiring capacitance such that a timing has no problem based on the electromagnetic interference noise estimated at the noise estimating step.

21. The electromagnetic interference analysis method as claimed in claim 20, wherein the step of correcting a signal wiring capacitance comprises a step of correcting a signal wiring width, a signal wiring length and a signal wiring path.

22. The electromagnetic interference analysis method as claimed in claim 18, wherein the correcting step comprises a power wiring layout correcting step of correcting a power wiring layout such that a voltage drop has no problem based on the electromagnetic interference noise estimated at the noise estimating step.

23. The electromagnetic interference analysis method as claimed in claim 22, wherein the power wiring layout correcting step comprises a step of correcting a power path, a power wiring width and a power wiring length.

24. The electromagnetic interference analysis method as claimed in claim 18, wherein the correcting step comprises a step of correcting a decoupling capacitance based on the electromagnetic interference noise estimated at the noise estimating step.

25. The electromagnetic interference analysis method as claimed in claim 18, wherein the correcting step comprises a step of correcting a connection relationship between a power supply and a capacitance based on the electromagnetic interference noise estimated at the noise estimating step.

26. An electromagnetic interference analysis apparatus for analyzing an electro magnetic interference amount of an LSI, comprising:

an equivalent impedance information calculating unit for calculating and estimating equivalent impedance information based on circuit information of an LSI chip and package information of the LSI chip; and an electromagnetic interference noise calculating unit for calculating an electromagnetic interference noise based on the equivalent impedance information.

27. The electromagnetic interference analysis apparatus as claimed in claim 26, wherein the equivalent impedance information calculating unit extracts a chip area, a power pad position and power supply information from the circuit information and extracts a package type from the package information, and wherein the electromagnetic interference analysis apparatus further comprises an estimating unit for calculating and estimating equivalent impedance information based on the information thus extracted.

28. The electromagnetic interference analysis apparatus as claimed in claim 26, wherein the circuit information includes floor plan information.

29. The electromagnetic interference analysis apparatus as claimed in claim 26, wherein the circuit information includes layout information.

30. The electromagnetic interference analysis apparatus as claimed in claim 26, wherein the circuit information includes netlist information.

31. The electromagnetic interference analysis apparatus as claimed in claim 30, wherein the netlist information includes circuit information on a function level.

32. The electromagnetic interference analysis apparatus as claimed in claim 30, wherein the netlist information includes circuit information on a gate level.

33. The electromagnetic interference analysis apparatus as claimed in claim 30, wherein the netlist information includes circuit information on a transistor level.

34. The electromagnetic interference analysis apparatus as claimed in claim 26, wherein the equivalent impedance information calculating unit comprises a memory block capacitance estimating unit for estimating a memory block as a capacitance from the circuit information.

35. The electromagnetic interference analysis apparatus as claimed in claim 26, wherein the equivalent impedance information calculating unit comprises a capacitance estimating unit for estimating a capacitance in consideration of an activation ratio.

36. The electromagnetic interference analysis apparatus as claimed in claim 26, wherein the equivalent impedance information calculating unit comprises a resistance value estimating unit for estimating a resistance value from the circuit information.

37. The electromagnetic interference analysis apparatus as claimed in claim 26, wherein the equivalent impedance information calculating unit comprises an equivalent resistance calculating unit for extracting circuit connection information from the circuit information, creating circuit connection information in which an active element is substituted for a predetermined resistance, and calculating an equivalent resistance.

38. The electromagnetic interference analysis apparatus as claimed in claim 36, wherein the resistance value estimating unit estimates a resistance value based on a chip area from the circuit information.

39. The electromagnetic interference analysis apparatus as claimed in claim 26, wherein the equivalent impedance information calculating unit comprises:

a database changing unit for changing inductance information for a wire length into a database;

a wire length calculating unit for calculating the wire length from the circuit information and the package information; and an inductance estimating unit for extracting the inductance information changed into the database from the wire length, thereby estimating an inductance.

40. The electromagnetic interference analysis apparatus as claimed in claim 26, further comprising a noise estimating unit for estimating an electromagnetic interference noise based on an equivalent impedance obtained by the equivalent impedance information calculating unit.

41. The electromagnetic interference analysis apparatus as claimed in claim 40, wherein the noise estimating unit comprises:
- a frequency response characteristic calculating unit for calculating a frequency response characteristic of the LSI from the equivalent impedance and the circuit information; and
- an estimating unit for estimating an electromagnetic interference noise of the LSI based on the frequency response characteristic.

42. The electromagnetic interference analysis apparatus as claimed in claim 41, wherein the noise estimating unit comprises:
- an offset value calculating unit for calculating an offset value based on a clock frequency and an estimated consumption power; and
- a second estimating unit for multiplying the frequency response characteristic by the offset value, thereby estimating an electromagnetic interference noise.

43. The electromagnetic interference analysis apparatus as claimed in claim 40, further comprising a correcting unit for carrying out a correction in order to optimize an electromagnetic interference noise based on the equivalent impedance thus obtained.

44. The electromagnetic interference analyses apparatus as claimed in claim 43, wherein the correcting unit comprises an inductance correcting unit for correcting a power terminal position, a package type and a wire length in order to correct an inductance based on the electromagnetic interference noise estimated by the noise estimating unit.

45. The electromagnetic interference analysis apparatus as claimed in claim 43, wherein the correcting unit comprises a capacitance correcting unit for correcting a signal wiring capacitance such that a timing has no problem based on the electromagnetic interference noise estimated by the noise estimating unit.

46. The electromagnetic interference analysis apparatus as claimed in claim 45, wherein the capacitance correcting unit includes correcting means for correcting a signal wiring width, a signal wiring length and a signal wiring path.

47. The electromagnetic interference analysis apparatus as claimed in claim 43, wherein the correcting unit comprises a power wiring layout correcting unit for correcting a power wiring layout such that a voltage drop has no problem based on the electromagnetic interference noise estimated by the noise estimating unit.

48. The electromagnetic interference analysis apparatus as claimed in claim 47, wherein the power wiring layout correcting unit comprises correcting means for correcting a power path, a power wiring width and a power wiring length.

49. The electromagnetic interference analysis apparatus as claimed in claim 43, wherein the correcting unit includes a decoupling capacitance correcting unit for correcting a decoupling capacitance based on the electromagnetic interference noise estimated by the noise estimating unit.

50. The electromagnetic interference analysis apparatus as claimed in claim 43, wherein the correcting unit comprises a connection relationship correcting unit for correcting a connection relationship between a power supply and a capacitance based on the electromagnetic interference noise estimated by the noise estimating unit.

* * * * *